(12) United States Patent
Hasegawa et al.

(10) Patent No.: US 7,387,867 B2
(45) Date of Patent: Jun. 17, 2008

(54) MANUFACTURING METHOD OF SEMICONDUCTOR INTEGRATED CIRCUIT DEVICE

(75) Inventors: Norio Hasegawa, Tokyo (JP); Katsuya Hayano, Tokyo (JP); Shoji Hotta, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 494 days.

(21) Appl. No.: 10/967,277

(22) Filed: Oct. 19, 2004

(65) Prior Publication Data

US 2005/0090120 A1    Apr. 28, 2005

(30) Foreign Application Priority Data

Oct. 23, 2003    (JP)    ............... 2003-363005

(51) Int. Cl.
*G03F 7/00*    (2006.01)
(52) U.S. Cl. ............... 430/311; 430/5; 430/394
(58) Field of Classification Search ............... 430/5, 430/394, 311
See application file for complete search history.

(56) References Cited

U.S. PATENT DOCUMENTS

2002/0006734 A1 * 1/2002 Imai et al. ............... 438/735
2002/0102473 A1 * 8/2002 Tange et al. ............... 430/5

FOREIGN PATENT DOCUMENTS

| JP | 6-83032 | 3/1994 |
| JP | 2001-230186 | * 8/2001 |

* cited by examiner

*Primary Examiner*—Mark F. Huff
*Assistant Examiner*—Caleen O Sullivan
(74) *Attorney, Agent, or Firm*—Antonelli, Terry, Stout & Kraus, LLP.

(57) ABSTRACT

In a massed region of each of a plurality of transfer areas of a mask a plurality of light transmission patterns are formed by opening a half-tone film. A phase shifter is disposed in each of the light transmission patterns so that a 180° phase inversion occurs between the lights that transmit through adjacent light transmission patterns. In a sparse region of the plurality of transfer areas a solitary light transmission pattern is formed by opening the half-tone film. Both shape and size are the same among the light transmission patterns, which are disposed symmetrically in both the massed and sparse regions about the center between the transfer areas. The phase shifters in the massed regions are disposed so that the phase of each phase shifter in one of the transfer areas comes to be opposed to that of its counterpart in the other transfer area. In the exposure process, those transfer areas are overlaid one upon another in the same chip region.

18 Claims, 21 Drawing Sheets

MANUFACTURING METHOD OF SEMICONDUCTOR INTEGRATED CIRCUIT DEVICE

CLAIM OF PRIORITY

The present invention claims priority from Japanese application JP 2003-363005, filed on Oct. 23, 2003, the content of which is hereby incorporated by reference into this application.

BACKGROUND OF THE INVENTION

The present invention relates to a technique for manufacturing a semiconductor integrated circuit device, and, more particularly, to a technique for exposing objects using a phase shift mask.

In the case of the next generation 65 nm node lithography, there is a demand for use of the ArF scanner which has been employed for the 90 nm node lithography. However, because the wiring length of the logic LSI for the 90 nm node lithography is about 100 to 120 nm and the K1 factor of $R=K1 \times \lambda /NA$ for denoting resolution R is about 0.5, the requirement for the 90 nm node lithography can be satisfied using a weak super resolution technique, while a strong super resolution technique is indispensable to satisfy the requirements for the 65 nm node lithography, since the 65 nm node wiring length must be about 70 to 90 nm, whereby the K1 factor becomes about 0.35. And, to realize such a super resolution technique, a highly accurate mask structure is required. Particularly, for example, in the case of the Levenson phase mask, which is one example of the available phase shift masks, it is required to realize a complicated mask structure accurately.

A phase shifting technique that constitutes a super resolution technique is disclosed, for example, in the official gazette of JP-A No. 83032/1994, as well as in the official gazette of JP-A No. 230186/2001, which has been applied for by the present inventor et al. The official gazette of JP-A No. 83032/1994 describes a problem that arises when an electron beam drawing resist or silicon dioxide is used for a phase shift material of the phase shift masks. The problem is attenuation of an exposure beam caused by the transmission factor of the subject phase shifter. To solve this problem, two masks in which phase shifters are disposed and reversed in phase are prepared, and those phase shifters are overlaid one upon another for overlay exposure, whereby the exposure beam attenuation in those phase shifters is complemented (refer to the patent document 1).

And, the official gazette of JP-A No. 230186/2001 discloses a method for making a recess in a transparent mask substrate to form an object phase shifter (recessed phase shifter structure) that enables double exposure for the phase inversion pattern, thereby eliminating the influence of the beam attenuation that might occur in the recessed part, as well as a method for using an auxiliary pattern for each solitary pattern in a phase shift mask having both an area to which massed patterns are to be transferred and an area to which a solitary pattern is to be transferred (refer to the patent document 2).

[Patent document 1] Official gazette of JP-A No. 83032/1994

[Patent document 2] Official gazette of JP-A No. 230186/2001

However, in the case of a technique that prepares an auxiliary pattern for each solitary pattern in a phase shift mask having both a massed region to which massed patterns are to be transferred and a sparse region to which a solitary pattern is to be transferred, the present inventor et al have found that the following problems arise from the use of the technique.

More specifically, the number of pattern data items used for designing a phase shift mask increases because of the disposition of the auxiliary patterns. In addition, a DA (Design Automation) processing is required to dispose those auxiliary patterns. These become problems in the practical use of the technique. In the processes used for the manufacture of a semiconductor integrated circuit device, the number of patterns in each mask will increase more and more in the future, so that it will become important to determine how to reduce the number of pattern data items when designing each mask.

SUMMARY OF THE INVENTION

Under such circumstances, it is an object of the present invention to provide a technique that is capable of reducing pattern data when designing each phase shift mask.

The above and further objects and novel features of the present invention will more fully appear from the following detailed description when the same is read in conjunction with the accompanying drawings.

Typical aspects of the invention to be disclosed in this specification will be described briefly as follows.

According to one aspect of the present invention, the method for manufacturing a semiconductor device includes a step of exposing a plurality of transfer areas that are overlaid one upon another in one area of a photo-resist film formed on a wafer. And, a plurality of light transmission patterns formed by opening a half-tone film are disposed in a pattern massed region of each of the plurality of transfer areas. A phase shifter is disposed in each of the plurality of light transmission patterns in the pattern massed region of each transfer area so that a phase difference occurs between the lights that transmit through adjacent light transmission patterns, while a solitary light transmission pattern formed by opening a half-tone film is disposed in a sparse region of each transfer area. Both the shape and the size are the same among all of the light transmission patterns which are disposed in the massed and sparse regions in the plurality of transfer areas, while the phase shifters in the massed regions of the plurality of transfer areas are disposed so that the phase of each phase shifter in one massed region is to be opposed to that of its counterpart in the other massed region.

The effect to be obtained by the typical aspects of the invention disclosed in this specification will be described briefly as follows.

The present invention requires no auxiliary pattern for any light transmission pattern in each sparse region, so that pattern data can be reduced when designing each phase shift mask.

DETAILED DESCRIPTION OF THE PREFERRED EMBODIMENTS

Figure 1:
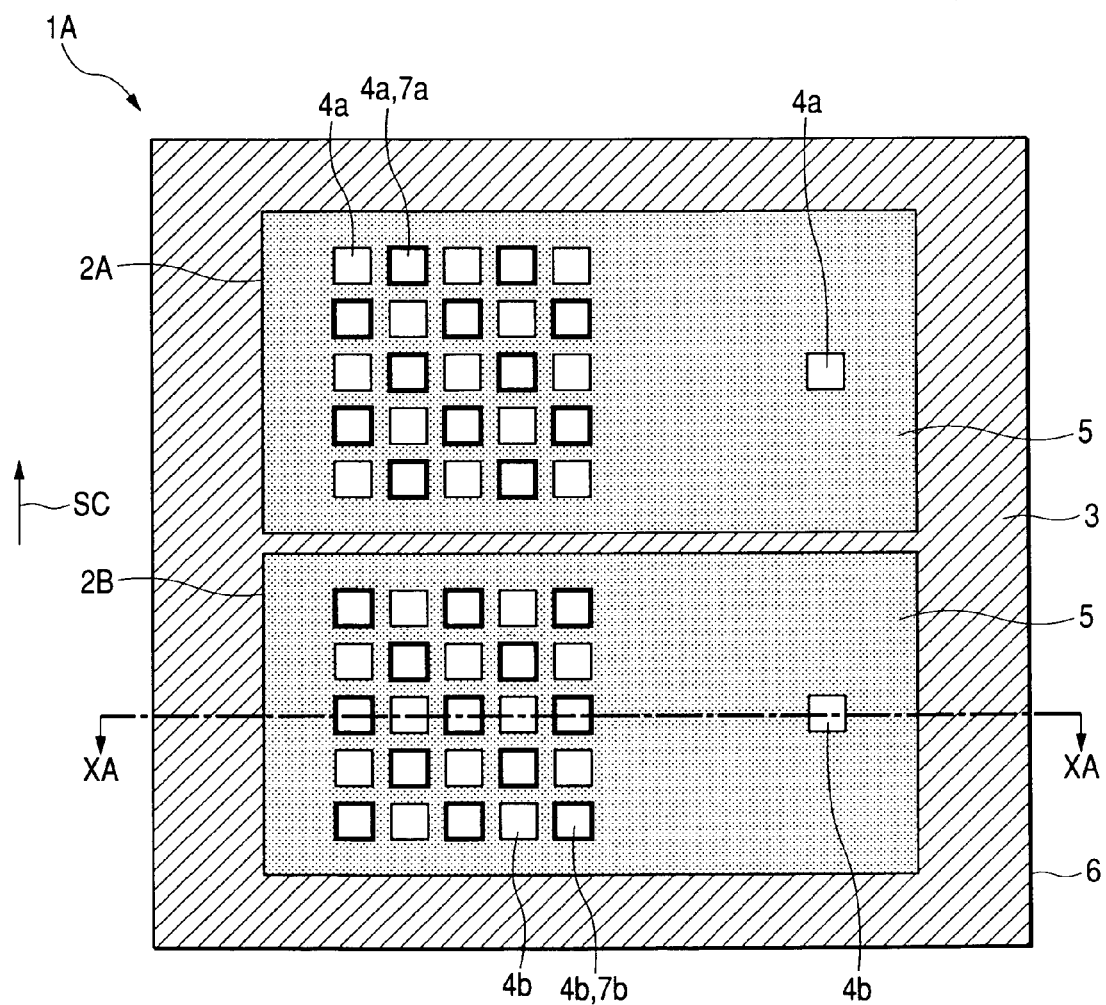
FIG. 1 is an overall top view of a mask used for manufacturing a semiconductor device according to an embodiment of the present invention.

Hereunder, the present invention will be described in a plurality of sections or embodiments as needed. Unless otherwise pointed out specially, however, each of those sections/embodiments is related to others partially or wholly in the description of variations, details, and supplements thereof. In the following description of the embodiments, the number of elements (including quantity, number, amount, range, etc.) is not limited specially, unless otherwise pointed out specially and limited to a specific number apparently in principle; and the number of elements may be over or under the specific number. And, needless to say, in the embodiments, the components (including element steps, etc.) are not always indispensable unless otherwise pointed out specially and except when they are apparently indispensable in principle. Similarly, in the embodiments, the shape of each component, a positional relationship among components, etc. to be described below include those approximate or similar to them practically, unless otherwise pointed out specially and except when they are not related apparently in principle. This is also the same in both the numbers and ranges mentioned above. And, in the following description of the embodiments, the same reference numerals and symbols will be used for the same functional items to avoid redundant description. Hereinafter, preferred embodiments of the present invention will be described in detail with reference to the accompanying drawings.

First Embodiment

Figure 2:
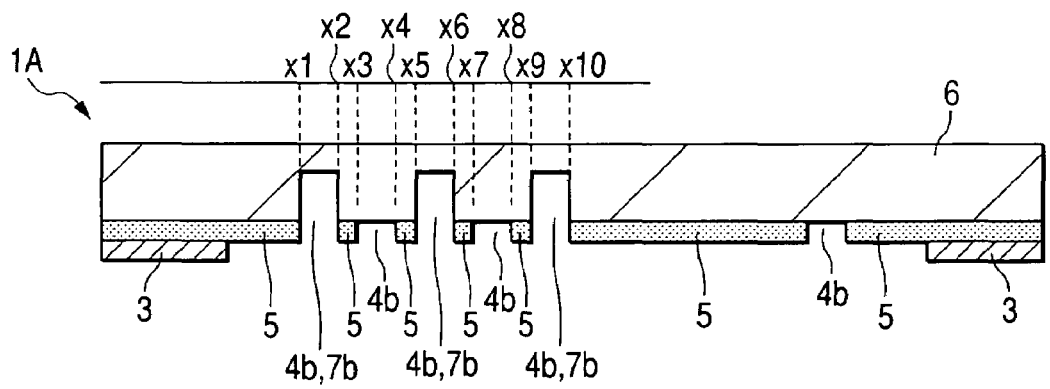
FIG. 2 is a cross sectional view of the mask taken along line XA-XA in FIG. 1.

FIGS. 1 and 2 show an example of a mask employed for a method of manufacture of a semiconductor integrated circuit device according to a first embodiment of the present invention. FIG. 1 shows an overall top view of the mask 1A of this first embodiment of the present invention. FIG. 2 shows a cross sectional view of the mask 1A as seen along line XA-XA in FIG. 1. The top view of the mask 1A shown in FIG. 1 is hatched specially to make it easier to understand the description. And, coordinates x1 to x10 are given to describe areas of the mask 1A in detail.

The mask 1A in this first embodiment is used to transfer hole patterns (contact holes or through-holes) as integrated circuit patterns. On a main surface of this mask 1A, there are disposed, for example, two transfer areas 2A and 2B in the vertical direction (the scanning direction SC of an exposure apparatus) as seen in FIG. 1 so as to be limited by a shielding pattern 3. Each of the transfer areas 2A and 2B is equivalent to, for example, an area to which a semiconductor chip (hereinafter, to be referred to simply as a chip) is transferred. In this first embodiment, these two transfer areas 2A and 2B are overlaid one upon another for overlay exposure, whereby desired hole patterns come to be transferred to a photo-resist film in one chip area of an object semiconductor wafer (hereinafter, to be referred to simply as a wafer). This is why light transmission patterns 4a and 4b used to transfer hole patterns are provided in the transfer areas 2A and 2B. The light transmission patterns 4a and 4b are formed there by opening part of a half-tone film 5. The half-tone film 5 is made of, for example, chrome (Cr) or molybdate silicide (MoSi). The half-tone film 5 functions as a half shielding (half transparent) film to reduce the transmission of the exposure light to 4 to 6%, as well as to invert the phase of the light that transmits through the half-tone film 5 by 180° with respect to the phase of the light that transmits through the light transmission patterns 4a and 4b, that include no half-tone film 5. In this first embodiment, each of the transfer areas 2A and 2B has a half-tone film that functions as its background. In other words, the transfer areas 2A and 2B, except for the light transmission patterns 4a and 4b, are assumed to be half shielding (half transparent) areas covered entirely by a half-tone film 5. The outer periphery of each of the transfer areas 2A and 2B has the shielding pattern 3 formed on the half-tone film 5 and is assumed to be a shielding region. The shielding pattern 3 is made of chrome, chrome oxide, or to be formed as a laminated film consisting of those material layers. The mask substrate 6 is made of transparent synthesized silica glass.

As shown in FIG. 1, each of the transfer areas 2A and 2B has a massed region (left side) and a sparse region (right side). In the massed region there are, disposed closely, a plurality of light transmission patterns 4a/4b used to transfer hole patterns. On the other hand, in the sparse region of each transfer area 2A/2B there is disposed solitarily a light transmission pattern 4a/4b used to transfer a hole pattern. In FIG. 1, only one light transmission pattern 4a/4b is provided in the sparse region in each transfer area 2A/2B, although a plurality of light transmission patterns may be disposed there. In that case, if light transmission patterns are disposed adjacently while the lights that transmit through the adjacent patterns do not interfere with each other, they are regarded to be solitary patterns in a sparse region. In the transfer areas 2A and 2B, both the shape and the size of the designed light transmission patterns 4a and 4b are assumed to be the same. And, in the massed region of each of the transfer areas 2A and 2B, phase shifters 7a/7b are provided as denoted by a thick line so that a phase difference of 180° is assumed between the lights that transmit through adjacent light transmission patterns 4a/4b. In other words, the massed regions of the transfer areas 2A and 2B are assumed to be Levenson type ones that are capable of realizing a stronger super resolution. Because a phase shifter 7A/7b is provided in each light transmission pattern 4a/4b in each massed region, the semiconductor integrated circuit device can have a high resolution characteristic because of such a phase shifting effect.

The light transmission patterns 4a and 4b in the massed and sparse regions are disposed symmetrically in the transfer areas 2A and 2B of the mask 1A. This is why both the shape and the size are the same among the designed light transmission patterns 4a and 4b to be overlaid one upon another. However, the phase of each phase shifter 7a in the transfer area 2A is opposed to that of its counterpart 7b in the transfer area 2B. In other words, the phase shifters 7a and 7b are disposed so that a phase difference of 180° occurs between the light that transmits through a predetermined light transmission pattern in the massed region of the transfer area 2A and the light that transmits through a predetermined counterpart light transmission pattern in the massed region of the transfer area B when in overlay exposure. In that connection, the transfer area 2A is overlaid upon the transfer area 25 in one chip area of the subject wafer.

In this embodiment, the phase shifters 7a and 7b are groove phase shifters. Each of the phase shifters 7a and 7b is formed with a recessed groove formed in the mask substrate itself. The depth Z of the phase shifters 7a and 7b satisfies $Z=\lambda/(2(n-a))$ to produce a phase difference of 180° between adjacent transmitted lights. The term "n" in the above expression denotes the refractive index of the mask substrate 6 and the "λ" denotes the exposure light wavelength with respect to exposure light having a predetermined exposure light wavelength. If no multiple exposure is to be carried out, the error range of the phase shifters 7a and 7b must be as narrow as possible, for example, the error of the phase angle must be within ±5° (also the same for the halftone phase shifters) This is why it is very difficult to manufacture masks, and this makes the mask yield lower. On the other hand, in this first embodiment, even when the absolute phase accuracy (error is accuracy) becomes slightly worse by such multiple exposure, it is possible to obtain the same resolution properties as those obtained when the phase difference is 180°. This is why the size accuracy of patterns to be transferred onto a wafer can be improved. The phase angle error range may be over ±5° (over 180° and under 175°), and the depth error range of the shifters 7a and 7b is thus eased. The mask A1 therefore comes to be manufactured far more easily, thereby the manufacturing yield of the mask A1 is improved significantly. And, the cost of the mask A1 is also reduced. Particularly, in the first embodiment in which the transfer areas 2A and 2B to be overlaid one upon another are formed in different places on the same plane, the depth and the error occurrence of the phase shifters 7a and 7b can be almost equalized all over the main surface of the mask substrate, unlike the embodiment in which the transfer areas 2A and 2B to be overlaid one upon another are formed in different masks. The mask Al can thus be manufactured easily while the absolute value accuracy of relatively high phases is assured. And, because only one mask 1A is used for exposure, the throughput is improved more than in a case in which the transfer areas 2A and 2B are disposed under different masks. However, it is also possible that the transfer areas 2A and 2B are disposed under different masks and each wafer is exposed using a mask having the transfer area 2A; then, the mask is replaced with another one having the transfer area 2B for double exposure. This method is effective for large chips in which the two transfer areas 2A and 2B cannot be disposed under the same mask.

In the case of one shot of exposure, the intensity of the light that transmits through each of the light transmission patterns 4a and 4b in which the phase shifters 7a and 7b are disposed is attenuated, so that a size difference might occur between transferred patterns according to whether or not phase shifters 7a and 7b are disposed in the subject light transmission patterns. On the other hand, overlay exposure is carried out in this first embodiment, whereby the lights that transmit through the light transmission patterns 4a and 4b in which phase shifters 7a and are disposed and the lights that transmit through the light transmission patterns 4a and 4b in which none of the shifters 7a and 7b is disposed come to be exposed in layers in one area, so that both of the light intensities are averaged. In other words, such unbalance between light intensities is canceled, thereby the same light intensity is distributed all over the entire target surface. This is why variation of the transfer pattern size is suppressed or prevented and the accuracy of the transfer pattern size is improved. The characteristics and reliability of the semiconductor integrated circuit device are thus improved.

Another factor that causes a transferred pattern size difference according to whether or not phase shifters 7a and 7b are disposed in the object light transmission patterns is attenuation of the intensity of the transmitted light. The attenuation occurs because of the side wall of the subject phase shifter groove formed in the mask substrate. Usually, therefore, a hood structure is employed to prevent the problem. The hood structure enables the side wall of the subject phase shifter groove to be adjusted so as to be hidden under the shielding pattern so that an end part of the shielding pattern is extruded like a hood. If this structure is employed, the intensity of the light that transmits through a light transmission pattern in which a groove type phase shifter is disposed comes to almost match the intensity of the light that transmits through the light transmission pattern in which no groove type phase shifter is disposed, although they do not match completely under the present conditions. According to the present inventor et al, the difference among transferred pattern sizes comes to be changed in accordance with the size of the patterns to be formed on the subject wafer. And, it is found that the hood structure employed for the groove type phase shifters simply is not sufficient to eliminate the difference among those transfer pattern sizes. On the other hand, in this first embodiment, the difference among transferred pattern sizes caused by whether or not phase shifters are disposed and/or in accordance with the size of patterns can be suppressed, and the size accuracy of transferred patterns is improved without providing any minute hood. The mask 1A thus comes to be manufactured far more easily. In other words, because the number of processes for manufacturing the mask 1A is reduced, the manufacturing time of the mask 1A is reduced. In addition, the manufacturing yield of the mask 1A is improved. Particularly, the longer the hood is, the more effectively the hood structure will function. However, because the mask 1A pattern is also reduced in size to meet the demand for reducing the patterns on wafers in size, it is naturally limited to extend the length of the hood. This is why the technique in this first embodiment is effective to significantly reduce the patterns in size, since it can improve the pattern size accuracy without employing the hood structure.

On the other hand, no phase shifter 7a/7b is provided in any of the light transmission patterns 4a and 4b in the sparse regions of the transfer areas 2A and 2B. In each sparse region, a phase difference of 180° is generated between the lights that transmit through the light transmission patterns 4a and 4b and between the lights that transmit through the half-tone film 5 around the sparse region, whereby the hole patterns are transferred favorably to the photo-resist film on the object wafer. At that time, the coherent factor (σ value) of the beam source of the subject exposure apparatus should be as small as possible. In the normal method, conditions are set to satisfy intermediate requirements, although they do not satisfy optimal requirements for the resolution characteristics of both the sparse and massed regions. This is why it is impossible to improve the resolution characteristics of patterns in both the sparse and massed regions up to the maximum. In this first embodiment, however, a small a value illumination close to the coherent is used, so that each solitary pattern can have enough resolution due to the effect of the half-tone phase shift mask. Consequently, the first embodiment of the present invention can improve the characteristics and reliability of the semiconductor integrated circuit device.

In the case of a mask having a shielding film formed around each of the light transmission patterns 4a and 4b, if both sparse and massed regions exist together in one transfer area of the mask, an auxiliary pattern must be provided around each of the light transmission patterns 4a and 4b in both of the massed and sparse regions and a phase difference of 180° is required between the light that transmits through each of the light transmission patterns 4a and 4b in the sparse regions and the light that transmits through the auxiliary pattern around each of the patterns 4a and 4b, so as to transfer the patterns in both the sparse and massed regions favorably onto the photo-resist film on the object wafer. The auxiliary patterns are formed by an aperture that can barely prevent transfer of a pattern onto the photo-resist film, respectively. However, because auxiliary patterns are provided in such a way, the number of pattern data items to be used when designing a mask increases, and a DA (Design Automation) processing is required for arranging the auxiliary patterns. This becomes a problem in practical use. In the manufacturing processes us for fabrication of the semiconductor integrated circuit device, the number of patterns in each mask is expected to increase more and more in the future, so that how to reduce the number of pattern data items will become a very important consideration when designing each mask. On the other hand, in the first embodiment, the half-tone film 5 in each sparse region can control the phase of each transmitted light to transfer hole patterns favorably on the object film. This is why there is no need to provide auxiliary patterns to the light transmission patterns 4a and 4b in the sparse regions. The number of pattern data items to be used when designing the mask 1A can be reduced significantly.

If it is expected to use a half-tone method in a sparse region, as described above, to reduce the number of pattern data items of the mask IA, a half-tone film is usually provided only for the background of the object sparse region and a shielding film is provided for the background of the massed region when designing a phase shift mask on which only one shot of exposure is to be made. Because the Levenson method is employed in each massed region to realize super resolution, as described above, a half-tone film 5 should not be provided for is the background of the massed region. Otherwise, the same phase comes to be assumed for both the light that transmits through the half-tone film 5 and the light that transmits through each of the light transmission patterns 4a and 4b in each massed region, whereby transfer of patterns onto the photo-resist film is disabled. However, if a shielding film is used for the background of a massed region, while a half-tone film 5 is used only for the background of a sparse region, three materials, that is, the shielding film, the light transmission patterns, and the half-tone film, each of which has transmissivity, reflectivity, etc., that are different from those of other materials, come to exist together in the transfer areas 2A and 2B on the same mask. Thus, it is difficult to set the fault detection sensitivity technically for detection and inspection of foreign matter and faults (irradiating an inspection beam on an object to detect transmitted and reflected lights to check for existence of faults/foreign matter in mask manufacturing processes). As a result, detection errors might occur. On the other hand, in the first embodiment, even when a half-tone film 5 is used for each background in both of the massed and sparse regions in the transfer areas 2A and 2B and the Levenson method is employed for each sparse region, the light transmission patterns 4a and 4b in both the massed and sparse regions can be transferred onto the photo-resist film favorably through double exposure, as described above. This is why the half-tone film 5 can be used for every background of the transfer areas 2A and 2B, as well as the massed and sparse regions in this first embodiment. In other words, the materials having different transmissivity and reflectivity of light in the transfer areas 2A and 25 can be reduced just to two types of half-tone film and the light transmission patterns 4a and 4b, so that the detection errors that might occur in mask manufacturing processes are suppressed or avoided.

Furthermore, according to this first embodiment, the multiple exposure is effective to average or eliminate faults existing at random in the transfer areas 2A and 23 on the mask 1A, so that transfer of faults using the mask 1A is suppressed or prevented. In addition, the transfer limit of faults using the mask 1A can be extended. In other words, size errors that have not been ignored so far can now be ignored. For example, at present, faults of 0.2 µm and over are transferred. In this first embodiment, however, faults of 0.4 µm and over are transferred. In other words, faults under 0.4 µm existing on the mask 1A can be ignored, so that the size limit in the fault inspection of the mask 1A is eased. Thus, fault inspection and fault correction of the mask 1A can be made easier, so that the mask 1A can be manufactured more easily. And, the aberration averaging effect and the mask 1A inner size distribution averaging effect can improve the accuracy of transferred patterns in size. Thus, characteristics and reliability of the semiconductor integrated circuit device are improved.

The number of transfer areas to be disposed for one mask 1A is varied freely; it is not limited only to the number described above. And, in the shielding region formed with the shielding pattern 3 at the outer periphery of each of the transfer areas 2A and 2B, there are formed such other light transmission patterns as mask alignment marks, measurement marks, etc. And, in each of the transfer areas 2A and 2B, there may be formed patterns used actually for the object integrated circuit, as well as patterns not used actually for the integrated circuit, such as alignment mark patterns used for overlaying objects one upon another, for inspecting objects overlaid one upon another, or for inspecting electrical characteristics. Even in this first embodiment, optical proximity correction (OPC) similar to the general one is required. For example, size correction is required for each of the distance between an object pattern and its adjacent pattern, the width between adjacent patterns, and the variable of denoting whether or not phase shifters exist. And, in this first embodiment, a mask has a wider concept that includes reticles. And, the terms "shielding region", "shielding pattern", "shielding film", or "shielding" indicate presence of an optical characteristic that enables 40% transmission of an exposure light irradiated onto an object area. Generally, the term "shielding" is used when such transmissivity is 0% to 30%. On the other hand, the terms "transmission area", "transmission pattern", "transparent area", "transparent film", or "transparent" indicate an item having an optical characteristic that enables more than 60% transmission of an exposure light irradiated on an object area. Generally, the term "transparent" is used when such light transmissivity is over 90%.

Next, the effect of overlay exposure using the mask IA will be described with reference to the simulation results.

Figure 3:
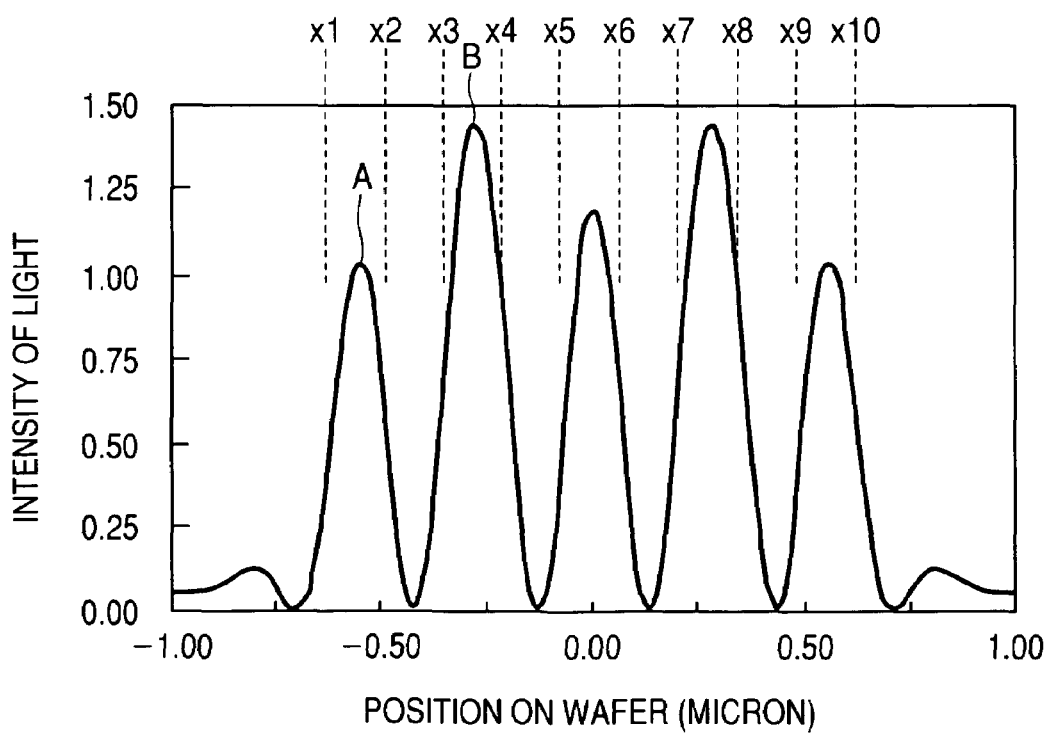
FIG. 3 is a graph illustrating an example of the light intensity distribution of an exposure light on a wafer, the exposure light transmitting regions being denoted by the coordinates x1 to x10 shown in FIG. 2.
Figure 4:
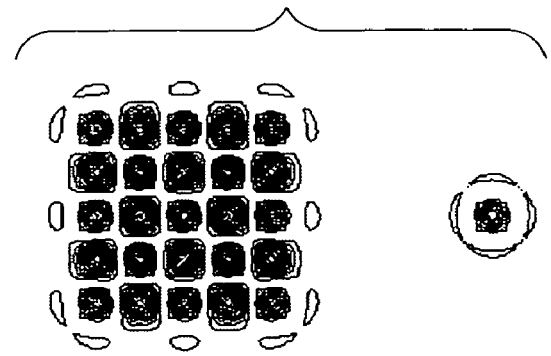
FIG. 4 is a diagram which illustrates the light intensity distribution in the upper transfer area of the mask shown in FIG. 1.
Figure 5:
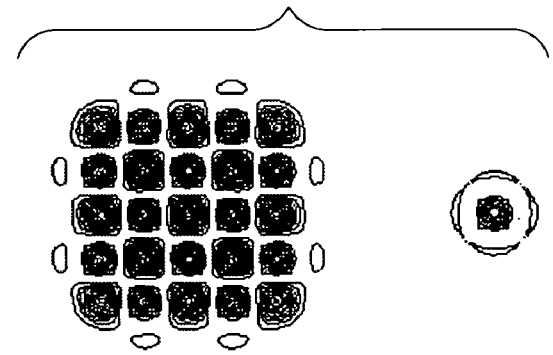
FIG. 5 is a diagram which illustrates the light intensity distribution in the lower transfer area of the mask shown in FIG. 1.
Figure 6:
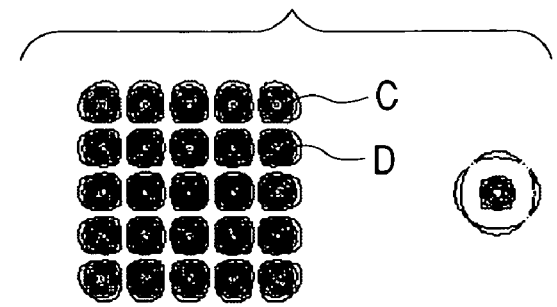
FIG. 6 is a diagram which illustrates the light intensity distribution of the light exposed onto the upper and lower transfer areas of the mask shown in FIG. 1, both transfer areas being overlaid one upon another.

FIG. 3 shows an example of light intensity distribution (INTENSITY PROFILE) of an exposure light that transmits through areas denoted by coordinates x1 to x10 in FIG. 2, measured on a wafer. Symbol A denotes the intensity of a light that transmits a light transmission pattern 4b in which a phase shifter 7b is disposed while symbol B denotes the intensity of a light that transmits through an ordinary light transmission pattern 4b in which the phase shifter 7b is not disposed. The intensity A of the light that transmits the phase shifter 7b is found to be lower than the intensity B of the light that transmits through the ordinary light transmission pattern 4b. FIGS. 4 through 6 show how contour lines of light intensity distribution are distributed. FIG. 4 shows the distribution of the light intensity in the transfer area 2A of the mask 1A while FIG. 5 shows the distribution of the light intensity in the transfer area 2B of the mask 1A. FIG. 6 shows the distribution of light intensity in overlay exposure for the transfer areas 2A and 25 of the mask 1A shown in FIG. 1 that are overlaid one upon another. Because double exposure is carried out for the transfer areas 2A and 2B in which the phase shifters 7a and 7b are disposed symmetrically, the light intensity values are averaged, thereby equal light intensity is obtained at adjacent light intensity peaks C and D. When a pattern is transferred actually, for example, a 182 nm pattern is formed favorably at an accuracy of ±15 nm all over the surface of the object chip including both massed and sparse regions. And, no special difference is recognized in the resolution level between adjacent patterns.

Figure 7:
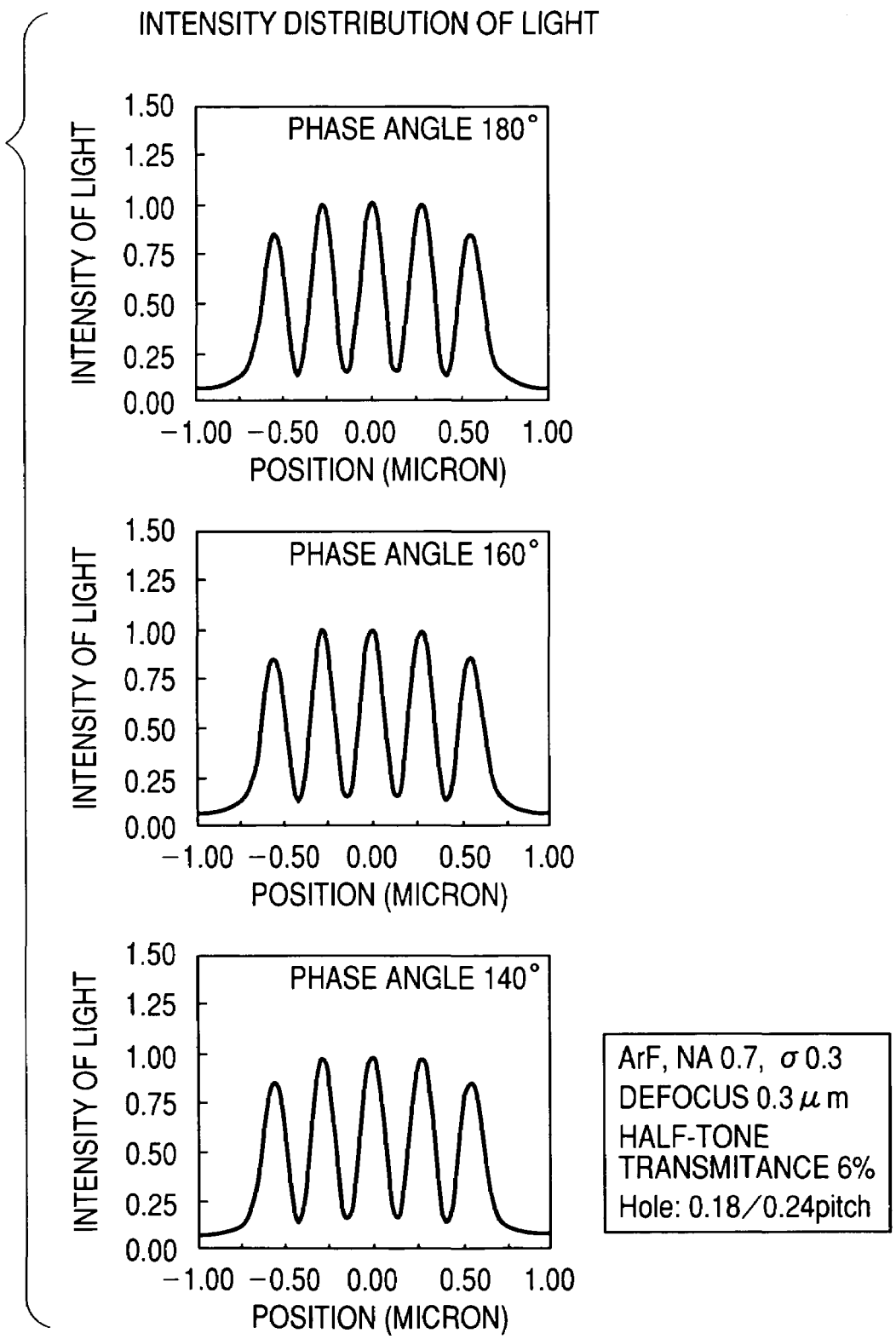
FIG. 7 is a series of graphs which illustrates an example of the light intensity distribution on a wafer obtained by shifting the phase difference between the lights that transmit through adjacent light transmission patterns in each transfer area in FIG. 1 by 180° (upper), 160°(middle), and 140° (lower) respectively.

FIG. 7 shows an example of light intensity distribution (INTENSITY PROFILE) on a wafer that is recognized each time a phase difference is generated between adjacent light transmission patterns 4a and 4a or 4b and 4b in the transfer area 2A or 23 by 180° (upper), 160° (middle), and 140° (lower). For example, the exposure light is an ArF beam (wavelength 193 nm), the aperture NA is 0.7, the coherent factor (σ value) is 0.3, the focal point is about 0.3 µm, the light transmissivity of the half-tone film is about 6%, the diameter of designed hole patterns to be transferred is 140 nm, and the pitch between designed adjacent hole patterns is about 0.24 nm. And, it is found that no special change is recognized in the light intensity distribution even when the phase difference between the lights that transmit the adjacent light transmission patterns 4a and 4a or 4b and 4b is shifted from 180°. In other words, favorable transfer of patterns is assured even when the phase difference is shifted from 180° by multiple exposure, as described above.

Figure 8:
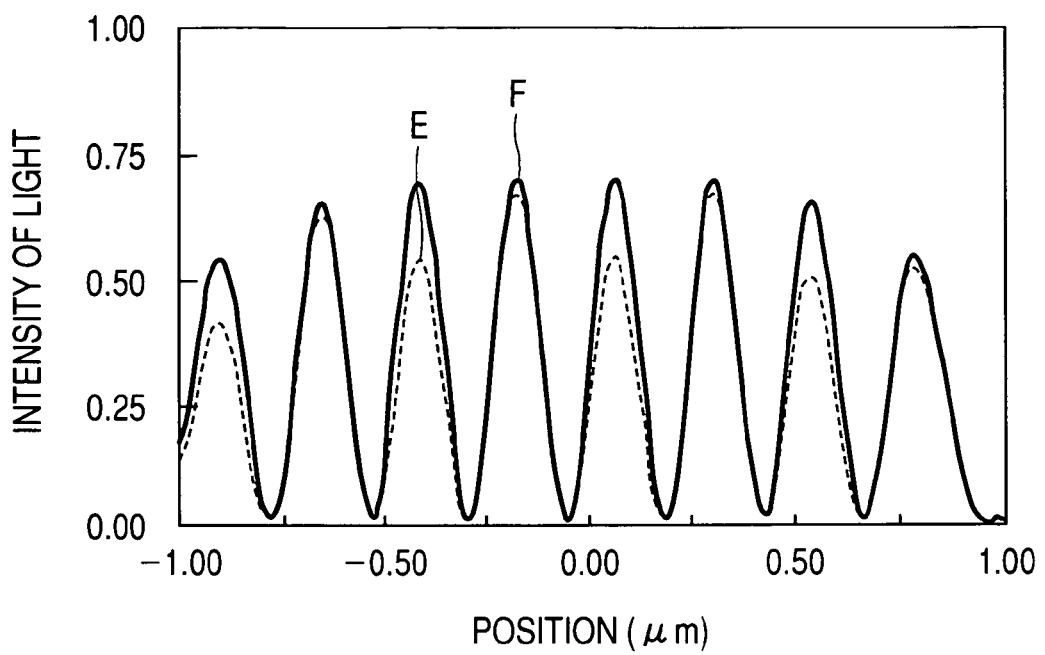
FIG. 8 is a graph showing a result of comparison after one shot of exposure between the light intensity distribution (dotted line) on a wafer when the phase difference between the lights that transmit through adjacent light transmission patterns in each transfer area is 165° and the light intensity distribution (solid line) on the wafer when the phase difference between the lights that transmit through the same is 180°.
Figure 9:
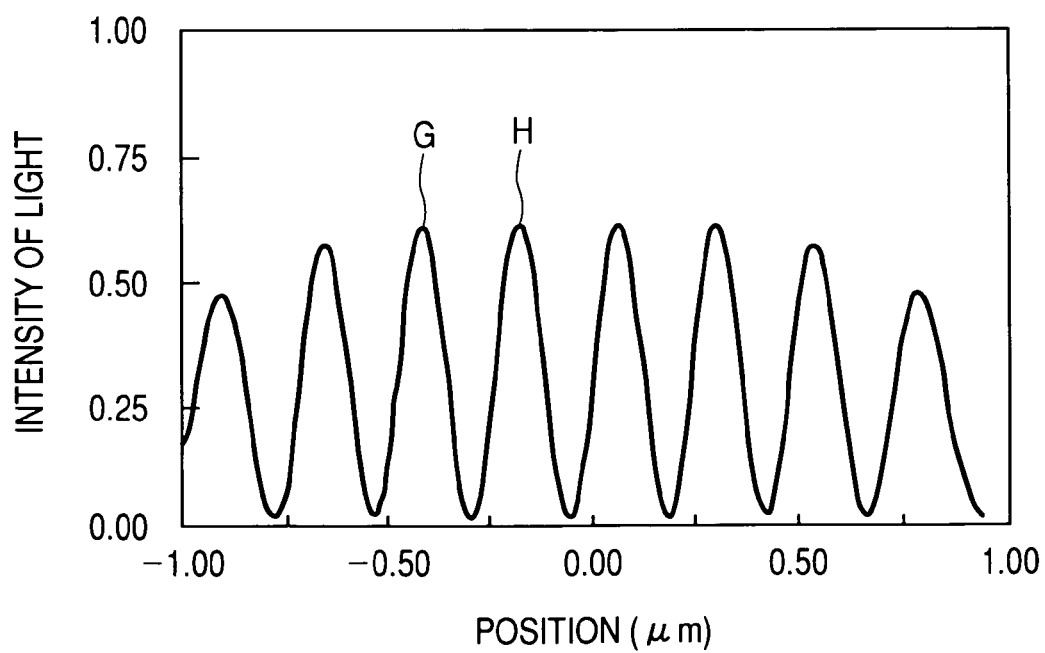
FIG. 9 is a graph showing a result of comparison of the light intensity distribution (dotted line) on a wafer after overlay exposure between when the phase difference between the lights that transmit through adjacent light transmission patterns in each transfer area using the mask shown in FIG. 1 is 180° and when it is 165°.

FIG. 8 shows a result of comparison between the light intensity distribution E (dotted line) on a wafer when the phase difference between the lights that transmit through adjacent light transmission patterns 4a and 4a or 4b and 4b in the transfer area 2A or 23 is 165° and the light intensity distribution F (solid line) on the wafer when the phase difference between the lights that transmit through the same light transmission patterns is 180° in the case of one shot of exposure. It is found that the light intensity distribution at the phase difference of 165° is smaller than that the light intensity distribution F at the phase difference of 180°. On the other hand, FIG. 9 shows the light intensity distribution on a wafer when a double shot of exposure is effected, using the mask 1A in this first embodiment. In this first embodiment, whether the phase difference is 165° or 180°, the light intensity becomes equal between adjacent light intensity peaks G and H.

Next, a description will be made, for an example, of how to manufacture the mask 1A in the first embodiment with reference to FIGS. 10 through 13. FIGS. 10 through 13 are cross sectional views at a line equivalent to the line XA-XA in FIG. 1 in manufacturing processes us in the fabrication of the mask 1A.

Figure 10:
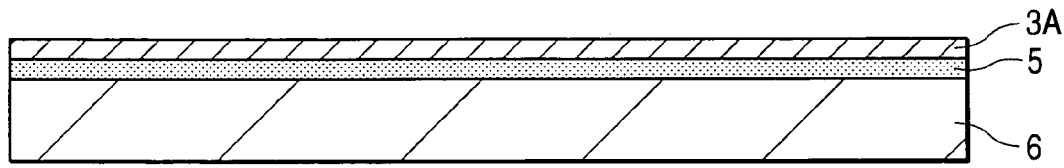
FIG. 10 is a cross sectional view of a mask substrate of the mask of FIG. 1 in a mask manufacturing process according to the present invention.
Figure 11:
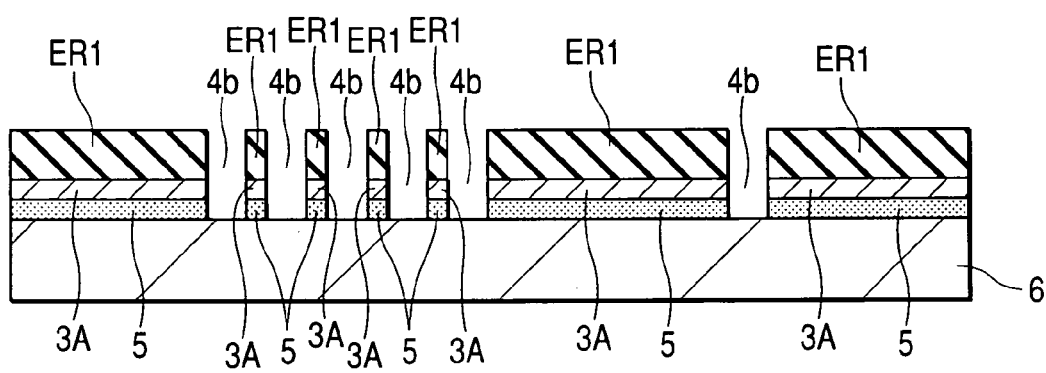
FIG. 11 is a cross sectional view of the mask substrate in a manufacturing process that follows the process shown in FIG. 10.

At first, a half-tone film 5 made of chrome, molybdenum silicide, or the like is deposited on a main surface of a mask substrate 6 as shown in FIG. 10 using, for example, the sputtering or CVD (Chemical Vapor Deposition) method. After that, a shielding film 3A made of chrome or the like is deposited on the surface using, for example, the sputtering method. Then, as shown in FIG. 11, a resist pattern ER1 used to form light transmission patterns is formed on the shielding film 3A by a series of lithography processes, such as coating of a resist film, exposure and development by an electronic beam or the like (hereinafter, to be referred simply as an electronic beam lithography process). After that, the resist pattern ER1 is used as a wet etching mask to etch the shielding film 3A and the half-tone film 5 to be exposed from the resist pattern ER1, thereby forming the light transmission patterns 4b(4a). Then, the resist pattern ER1 is removed.

Figure 12:
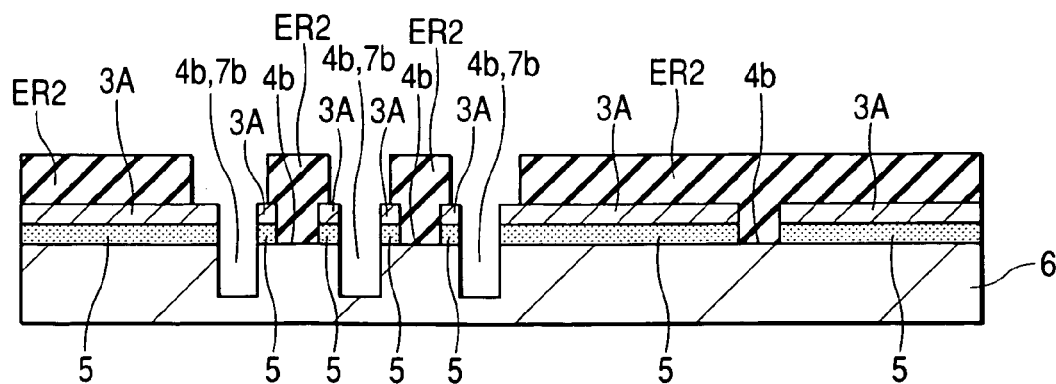
FIG. 12 is a cross sectional view of the mask substrate in a manufacturing process that follows the process shown in FIG. 11.

After that, as shown in FIG. 12, a resist pattern ER2 used 5 to form groove phase shifters is formed on the main surface of the mask substrate 6 in the electronic beam lithography process. At that time, there is no need to assume matching between the outer periphery of the aperture of the resist pattern ER2 and the outer periphery of the groove phase shifter forming area; part of the shielding film may be exposed from the aperture. The alignment margin can thus be set larger. After that, the resist pattern ER2 and the shielding film 3A to be exposed from each aperture are used as etching masks for anisotropy dry-etching to etch the resist pattern ER2 and part of the mask substrate 6 to be exposed from the shielding film 3A, thereby forming the groove type phase shifters 7b (7a). If no overlay exposure is done, the mask manufacturing comes to require much time and labor, thereby it becomes troublesome, since absolute control of the light phase is difficult. Therefore, the transmitted light phase must be measured actually while the groove phase shifters are formed, etching is done again after the resist pattern is formed in the electronic beam lithography process, then the depth of the groove is corrected according to the measurement result. On the other hand, in this first embodiment, because it is possible to ease the absolute value control (error allowance range) of the phases of the lights that transmit through the adjacent light transmission patterns 4a and 4a or 4b and 4b, the error allowance range for the groove depth required for forming the phase shifters 7b(7a) can be set comparatively large. It is thus possible to omit the above-mentioned troublesome works, such as actual measurement of the phases of the transmitted lights while groove phase shifters are formed, forming a resist pattern by the electronic beam lithography process again, and correcting the groove depth according to the measurement result. The manufacture of the mask 1A is thus simplified. And, the manufacturing time of the mask 1A is also reduced significantly. In addition, because the shielding film 3A is left over at each aperture of the resist pattern ER2, the lower half-tone film 5 is protected from damage by the dry-etching treatment. Consequently, the manufacturing yield and reliability of the mask 1A are improved.

Figure 13:
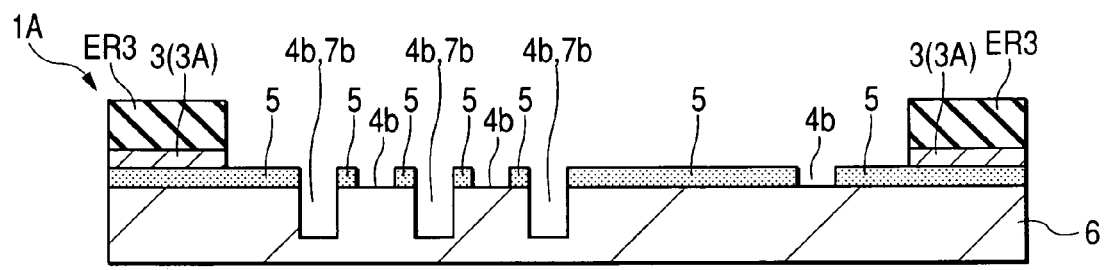
FIG. 13 is a cross sectional view of the mask substrate in a manufacturing process that follows the process shown in FIG. 12.

After that, the resist pattern ER2 is removed. Then, as shown in FIG. 13, a resist pattern ER3 used to form a shielding pattern is formed on the main surface of the mask substrate 6 by the electronic beam lithography process. After that, the resist pattern ER3 is used as an etching mask to etch the shielding film 3A to be exposed from the resist pattern ER3, thereby forming a shielding pattern 3. At that time, part of the shielding pattern 3 is removed to form various mark patterns, as described above. After that, the resist pattern ER3 is removed, with the result that the mask 1A as shown in FIGS. 1 and 2 is manufactured.

Next, a description will be given of an example of how to carry out multiple exposure using the mask 1A employed in the first embodiment, with reference to FIGS. 14 through 16.

Figure 14:
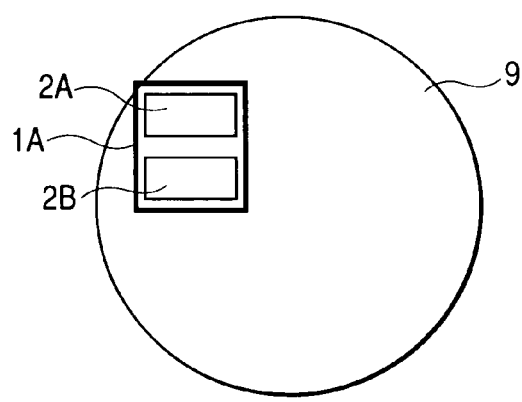
FIG. 14 is an overall top view of a wafer in a multiple exposure process.
Figure 15:
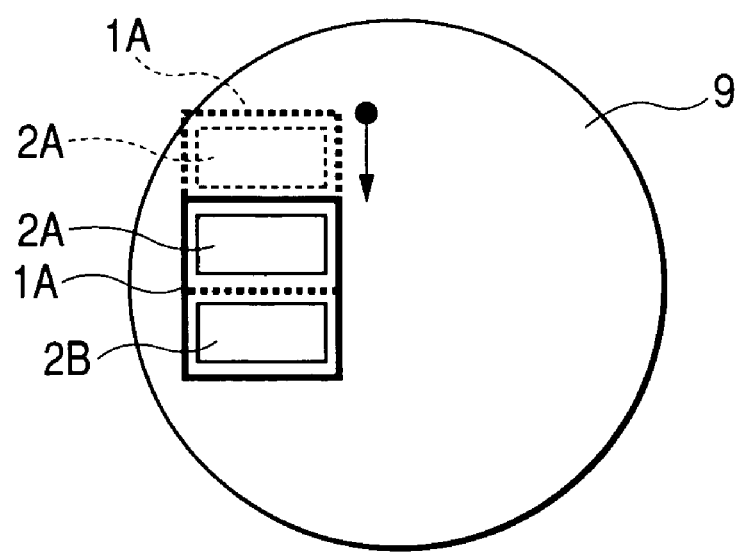
FIG. 15 is an overall top view a wafer in a multiple exposure process that follows the process shown in FIG. 14.
Figure 16:
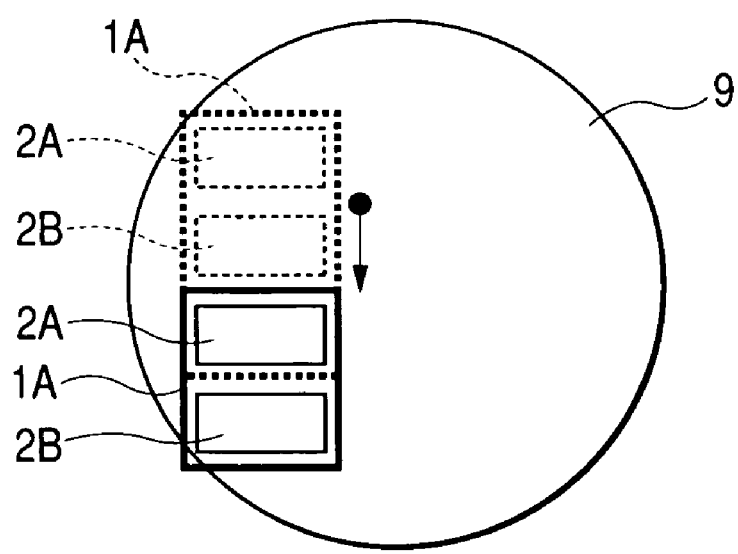
FIG. 16 is an overall top view of a wafer in a multiple exposure process that follows the process shown in FIG. 15.

FIGS. 14 through 16 show top views of a wafer 9 in multiple exposure processes. The wafer 9 is, for example, a disk-like thin plate having a substrate made of silicon. On the main surface (device forming surface) of the substrate 9, there is deposited a silicon oxide film having a thickness of about 200 nm. Then, a positive photo-resist film having a thickness of about 300 nm is coated thereon. The actual exposure conditions are as follows, for example. The reduced projection exposure apparatus uses a scanner. The scanner's beam source is an ArF excimer laser beam having a wavelength of 193 nm, and the aperture NA of the optical lens is 0.70. The scanner's beam source shape is circular (variation luminance) and the coherent factor (σ value) is 0.3. One shot of exposure onto the photo-resist film is 150 J/m$^2$ and it is adjusted to reach 300 J/m$^2$ at double exposure. In other words, the amount of one shot of exposure is decided by dividing the necessary exposure by the number of multiple exposure times. The minimum pattern in the mask 1A is a hole pattern having a diameter of about 180 nm in terms of the size of the pattern to be transferred onto the wafer 9.

At first, as shown in FIG. 14, the patterns in the transfer areas 2A and 213 of the mask 1A are exposed by scanning using the scanner 10. At that time, the exposure is about ½ of the necessary one. After that, as shown in FIG. 15, the wafer 9 is moved upward with respect to the mask 1A to enable the patterns in the transfer areas 2A and 23 of the mask IA to be exposed by scanning using the scanner 10. The distance the wafer 9 is moved at that time is ½ of the exposure area. The transfer area 2A of the mask 1A is thus overlaid upon the transfer area 25 of the mask 1A already transferred onto the photo-resist film of the wafer 9 in FIG. 14. The exposure at that time is also about ½ of the necessary one. Consequently, the necessary exposure is obtained when the transfer area 2A is overlaid upon the transfer area 23. Then, as shown in FIG. 16, the wafer 9 is moved upward with respect to the mask 1A to enable the patterns in the transfer areas 2A and 2B of the mask 1A to be exposed by scanning similar to the above exposure by scanning. At that time, the wafer 9 moves by ½ of the exposure area, so that the transfer area 2A of the mask 1A is overlaid upon the transfer area 2B of the mask 1A already transferred onto the photo-resist film of the wafer 9 in FIG. 15. The exposure at that time is also ½ of the necessary one, so that the necessary exposure is obtained when the transfer area 2A is overlaid upon the transfer area 23. Such a multiple exposure process is repeated to complete the exposure all over the main surface of the wafer 9, whereby hole patterns in the plurality of chip areas are transferred onto the main surface of the wafer 9. In the above description, double exposure is not done in some areas (such as a chip area located at the outermost periphery of the main surface of the wafer 9). Those areas that are not to be exposed are shielded by a masking blade before the double exposure process is carried out.

Figure 17:
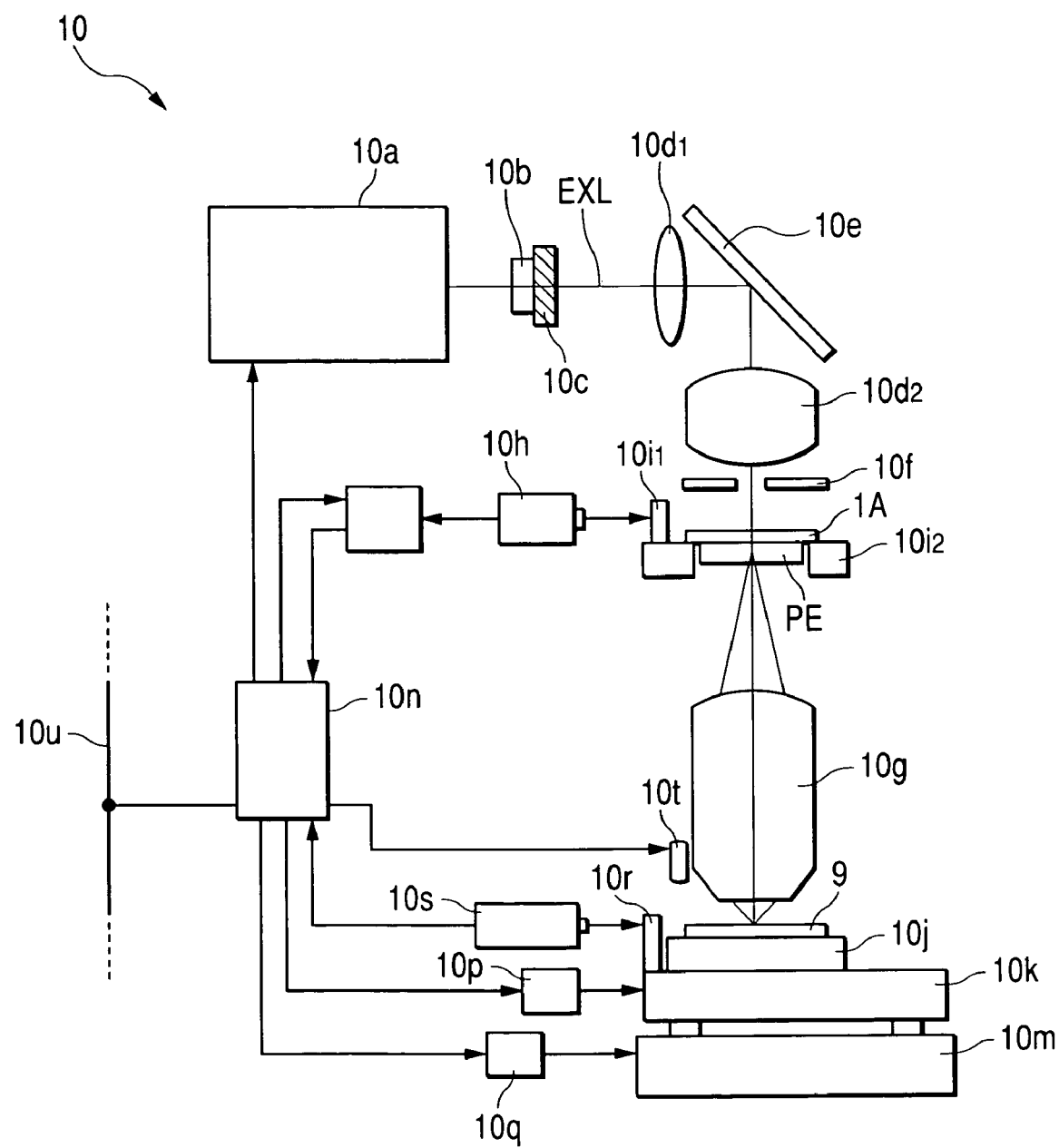
FIG. 17 is a block diagram of an exposure apparatus used for the method for manufacturing a semiconductor device according to an embodiment of the present invention.

Next, the scanner will be described. FIG. 17 shows an example of the scanner 10. The scanner 10 is a scanning type reduced projection exposure apparatus having a reduction ratio of 4:1, for example. The exposure conditions of the scanner 10 are as described in conjunction with FIGS. 14 through 16.

An exposure beam EXL that is emitted from an exposure beam source 10a is irradiated on a mask (reticle) 1A through a fly-eye lens 10b, an aperture 10c, condenser lenses 10d1 and 10d2, and a mirror 10e. The coherent factor of the optical conditions is adjusted by changing the size of the aperture part of the aperture 10f. On the mask 1A there is provided a pellicle PE which is used to prevent pattern transfer errors, etc. to be caused by foreign matter stuck on the mask 1A. The mask pattern formed on the mask 1A is projected on the photo-resist film on the main surface of the wafer 9, which is a sample substrate through a projection lens 10g. The mask 1A is supported on a mask stage 10i2, which is controlled by a mask position controlling means 10h and a mirror 10i1, by which the center of the mask 1A is aligned to the beam axis of the projection lens 10g accurately.

The wafer 9 is sucked by vacuum onto the sample base 10j the sample base 10j is supported on a Z stage 10k which is movable in the beam axial direction of the projection lens 10g, that is, in the direction (Z direction) perpendicular to the wafer-support surface of the sample base 10j. The sample base 10j is also supported on an XY stage 10m which is movable in the direction parallel to the wafer-support surface of the sample base 10j. The Z stage 10k and the XY stage 10m are driven by driving means 10p and 10q according to control commands received from a main control system 10n, so that they are movable to a desired exposure position. The exposure position is monitored accurately by a laser measuring machine 10s, to be determined as a position of the mirror 10r fixed to the Z stage 10k. A position on the surface of the wafer 9 is measured by a focal point detection means of any ordinary exposure apparatus. And, according to a measurement result, the Z stage 10k is moved to keep the main surface of the wafer 9 aligned to a focused image of the projection lens 10g.

The mask 1A and the wafer 9 are driven synchronously in accordance with a set reduction ratio, and an object exposure area on the main surface of the mask 1A is scanned while the mask patterns are transferred in a reduced size onto the photo-resist film on the main surface of the wafer 9. At that time, the position of the main surface of the wafer 9 is dynamically driven and controlled by the above-described means with respect to the scanning of the wafer 9. If the circuit pattern on the mask 1A is overlaid upon the circuit pattern formed on the wafer 9 to be exposed, the position of the mark patterns formed on the wafer 9 are detected by an alignment detection optical system 10t, and, according to the detection result, the wafer 9 is exposed after position alignment. The main control system 10n is connected to a network system 10u electrically so as to be enabled for remote monitoring of the state of the scanner 10.

Figure 18:
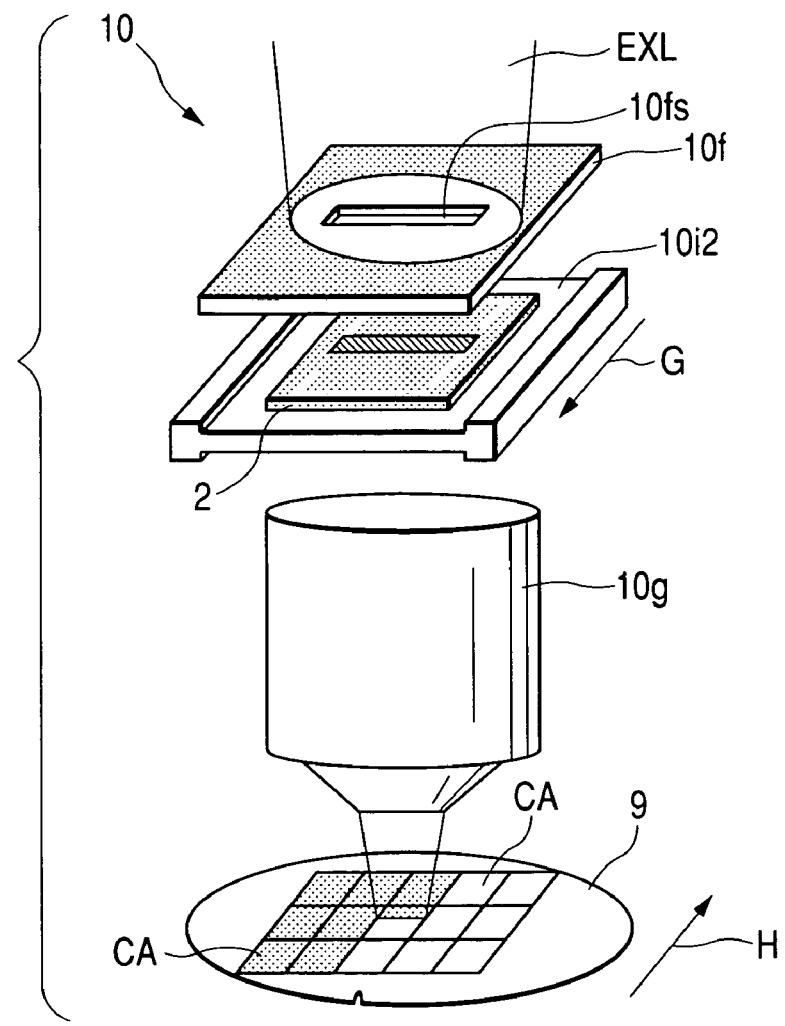
FIG. 18 is an exploded prospective view which illustrates major portions of the exposure apparatus shown in FIG. 17.
Figure 19:
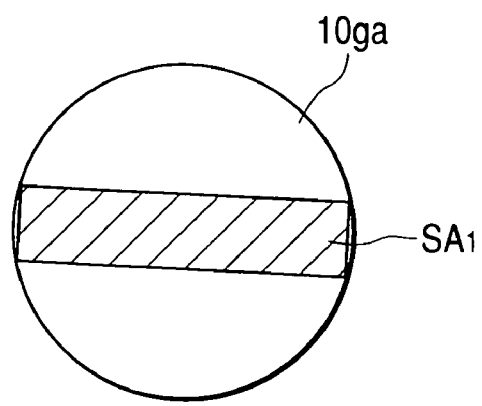
FIG. 19 is a diagram which illustrates an exposure area of the exposure apparatus shown in FIGS. 17 and 18.

FIG. 18 shows an example of an exposure performed by the scanning process carried out by the scanner 10. FIG. 19 shows an extracted exposure area of the scanner 10. Object areas in FIGS. 18 and 19 are hatched so as to make it easier to understand the description.

In an exposure by a scanning process using the scanner 10, the mask 1A and the wafer 9 are moved mutually the opposite directions, while their main surfaces are kept in parallel to each other. In other words, the mask 1A and the wafer 9 are disposed in positions of mirror symmetry, so that the mask 1A and the wafer 9 come to be scanned mutually in opposite directions, as shown by arrows G and H in FIG. 18. The mask 1A is thus set so that the transfer areas 2A and 23 are disposed in the scanning direction of the scanner 10. The driving distance is determined when the reduction ratio is 4:1, so that the moving distance of the mask 1A becomes 4 when the moving distance of the wafer 9 becomes 1. At that time, the exposure beam EXL is irradiated onto the mask 1A through a flat rectangular slit 10fs of the aperture 10f. In other words, a slit-like exposure area (exposure band) SA1 included in an effective exposure area 10ga of the projection lens 10g is used as an effective exposure area. Although not limited specially, the width (short direction size) of the slit 10fs is usually about 4 mm to 7 mm on the wafer 9. And, the slit-like exposure area SA1 is moved (scanned) continuously in the width direction (short direction) of the slit 10fs (that is, in a direction orthogonal or crossing obliquely the longitudinal direction of the slit 10fs), and then an exposure beam is irradiated onto the main surface of the wafer 9 through an image forming optical system (projection lens 10g). Consequently, mask patterns (integrated circuit patterns and hole patterns in the first embodiment) in the transfer areas 2A and 23 of the mask 1A are transferred to each of the plurality of chip areas CA on the wafer 9. In this embodiment, although only the necessary parts are shown to illustrate the functions of the scanner 10, other necessary parts of an ordinary scanner are the same as those in its ordinary functional range.

Figure 20:
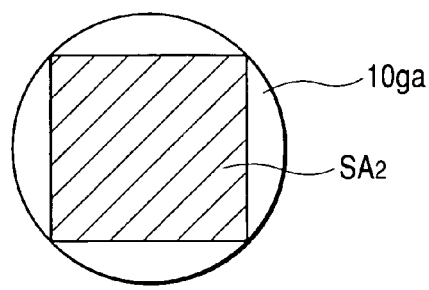
FIG. 20 is a diagram which illustrates an exposure area of another exposure apparatus that is different from that shown in FIGS. 17 and 18.

FIG. 20 shows an exposure area SA2 (hatched so as to make it easier to see in the drawing) when a stepper is used. In the stepper, when one shot of exposure is ended (for one chip or a plurality of chips), the stage is moved to the next shot position so that a similar exposure is repeated to expose the entire surface of the wafer. For the stepper, the flat square exposure area SA2 in the effective exposure area 10ga of the projection lens 10g is used as an effective exposure area. The four corners of this exposure area SA2 are inscribed in the effective exposure area 10ga. Although the method in this first embodiment can use a stepper as an exposure apparatus, it is usually difficult to form patterns favorably as designed if such a stepper is used for multiple exposure, since the projection lens log exhibits various types of aberration. On the other hand, in an exposure process that uses the scanner 10, a positional deviation occurs because of lens aberration in a direction orthogonal to the scanning direction. However, because the lens aberration of the transfer areas 2A and 23 become identical in the scanning direction, the shapes of the areas 2A and 2B remain the same. In this first embodiment, the scanner characteristics are employed effectively. If such a scanner is used, each pattern in the transfer areas 2A and 23 comes to have an almost similar variation in the direction orthogonal to the scanning direction, and the transfer areas 2A and 2B are formed almost in the same shape in the scanning direction. This is because the transfer areas 2A and 2B, for which overlay exposure is to be carried out are disposed in the scanning direction. Patterns are thus formed at a high overlay exposure accuracy even when in double exposure.

Second Embodiment

Figure 21:
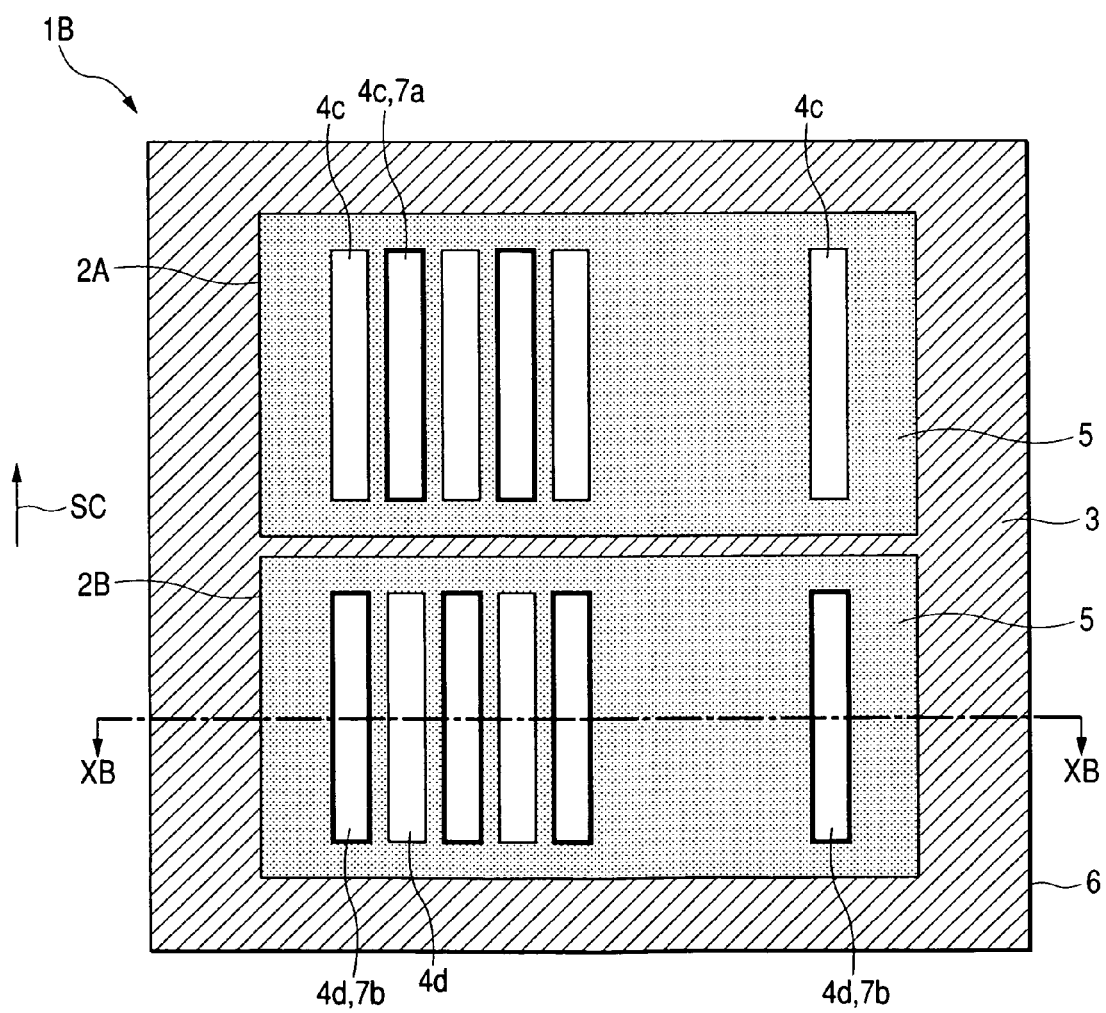
FIG. 21 is an overall top view of a mask used for the manufacture of a semiconductor integrated circuit device according to another embodiment of the present invention.
Figure 22:
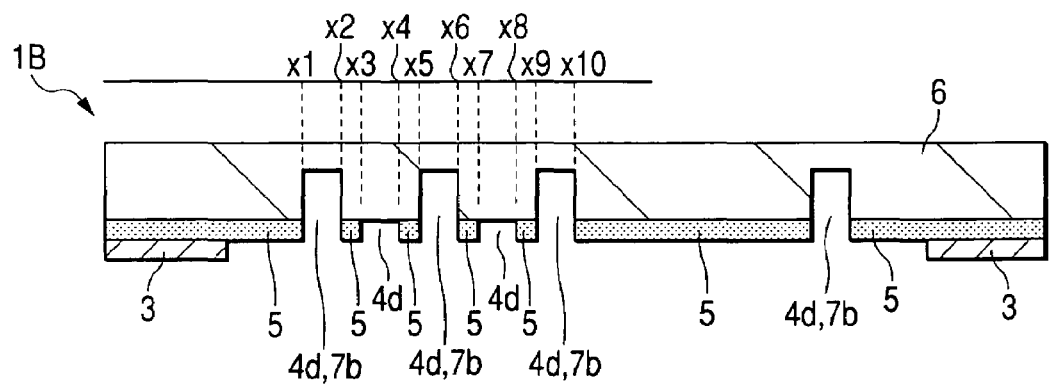
FIG. 22 is a cross sectional view of the mask taken along line XB-XB in FIG. 21.

In this second embodiment, the present invention is applied to a mask for transferring line patterns (gate electrodes or wirings) as integrated circuit patterns. FIG. 21 shows a top view of a mask 1B according to this second embodiment. FIG. 22 shows a cross sectional view of the mask 1B as seen along line XB-XB in FIG. 21. In each transfer area 2A/2B, there are flat band-like light transmission patterns 4c/4d used for transferring line patterns. In the massed region of each transfer area 2A/2B, a plurality of light transmission patterns 4c/4d are disposed side by side in the horizontal direction as seen in FIG. 21. In the massed region of each transfer area 2A/23, a phase shifter 7a/7b is disposed in every second one of the plurality of light transmission patterns 4c/4d. However, also in this second embodiment, phase shifters 7a and 7b are disposed symmetrically and are inverted in phase in the transfer areas 2A and 2B, just like in the first embodiment. In the sparse region in each transfer area 2A/2B, only one light transmission pattern 4c/4d is disposed. Although no phase shifter is disposed in the light transmission pattern 4c in the sparse region of the transfer area 2A, a groove type phase shifter 7b is disposed in the light transmission pattern 4d in the sparse region of the transfer area 23 to be overlaid upon the transfer area 2A. Particularly, in some cases, there is a light transmission pattern that is classified between a solitary pattern and a close pattern. In such a case, double exposure should be carried out for each pattern in both the massed and sparse regions; and, in that connection, the phase of each pattern is inverted in the second shot of exposure. The distribution of the intensity of the light that transmits through points denoted by the coordinates x1 to x10 in FIG. 22 is the same as that shown in FIG. 3 in the first embodiment.

If this mask 1B is used for an exposure process to transfer a desired pattern to an object wafer and the desired pattern forms holes and grooves in an insulation film or the like, a positive photo-resist film is used. If the desired pattern forms patterns on an insulation film or the like, a negative photo-resist film is used.

This second embodiment can also obtain the same effects as that in the first embodiment.

Third Embodiment

In this third embodiment, a description will be given of a method for forming phase shifters with a film (phase shift film stacking method or stacking phase shifter).

Figure 23:
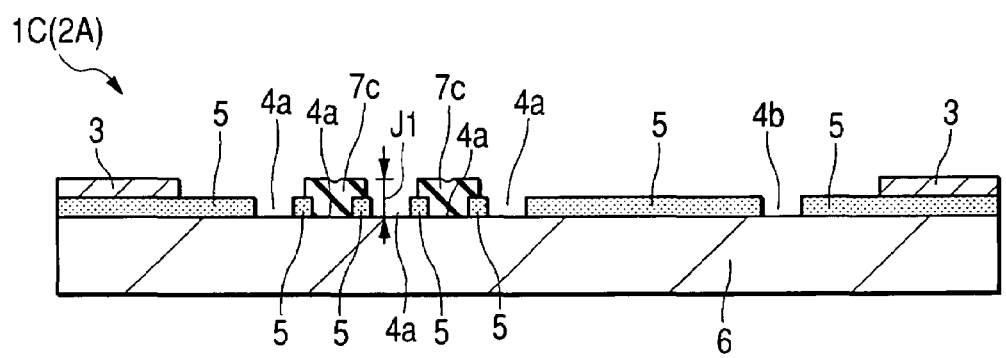
FIG. 23 is a cross sectional view of major portions of a mask used for manufacture of the semiconductor integrated circuit device in another embodiment of the present invention.
Figure 24:
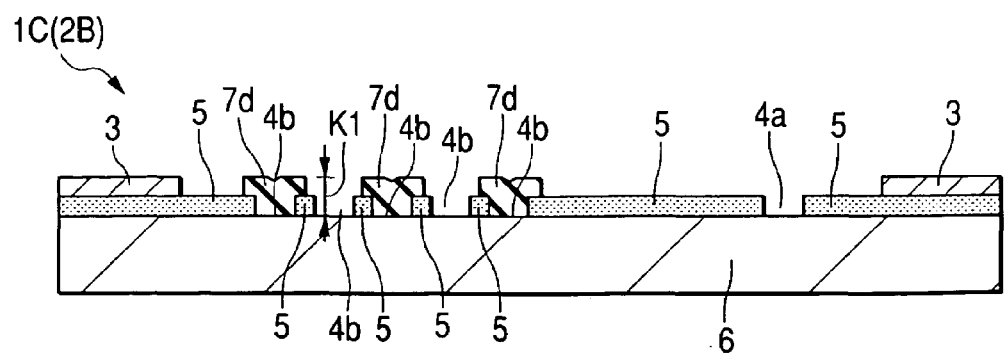
FIG. 24 is a cross sectional view of other major portions of the mask shown in FIG. 23.

FIGS. 23 and 24 show cross sectional views of the major portions at each of which the transfer areas 2A and 23 of the mask 1C in this third embodiment are overlaid one upon another for overlay exposure. FIG. 24 shows a cross sectional view of a portion at a line equivalent to the line XA-XA in FIG. 1, while FIG. 23 shows a cross sectional view of a portion to be overlaid upon the other portion shown in FIG. 24. The cross sectional view is for a portion at a line in parallel to the line XA-XA in the transfer area 2A in FIG. 1.

Figure 25:
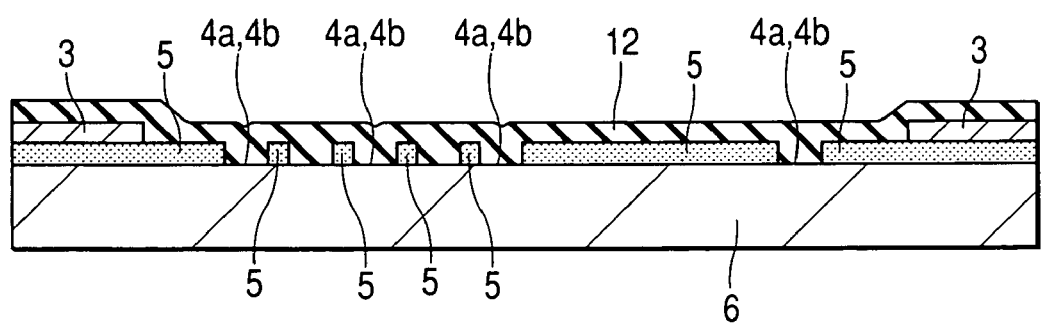
FIG. 25 is a cross sectional view of major portions of a mask shown in FIG. 23 in a manufacturing process.

In the mask 1C in this third embodiment, the phase shifters 7c and 7d are made of, for example, a resist film or a SOG (Spin On Glass) film. The top surface shape of the mask 1C is similar to any of those shown in FIGS. 1 and 21. If phase shifters are made of a film, the thickness of the phase shifters in the area of the main surface of the mask substrate 6 might be changed by the position, shape, and/or the like in the area of the surface of the underlayer pattern, whereby the thickness might not become equal all over the surface in some cases. And, if the thickness differs among phase shifters 7c and 7d, the phase of the transmitted light also changes among light transmission patterns. Thus, one shot of exposure might come to be insufficient to transfer patterns favorably. On the other hand, in this third embodiment, because overlay exposure is carried out as described above, the absolute value controlling (allowable error range) for transmitted light phases is eased. Therefore, exposure can be made with no problem regardless of a slight difference in thickness among the phase shifters 7c and 7d in the transfer areas 2A and 2B. The light transmission patterns 4a and 4b for which the, transfer areas 2A and 2B are overlaid one upon another are almost the same (symmetrical) in both position and shape on the main surface of the mask substrate 6. Thus, the thickness J1 of the phase shifters 7c is almost the same as the thickness K1 of the phase shifters 7d. This is why no phase difference problem arises between transmitted lights in the areas to be overlaid one upon another. To manufacture such a mask 1C, as shown in FIG. 25, a phase shift film 12 consisting of a resist film, SOG film, or the like is deposited on the main surface of the mask substrate 6 on which the shielding patterns 3 and the patterns of the half-tone film 5 are already formed, then the phase shift film 12 is patterned by a lithography process to form phase shifters 7c and 7d. If a resist film is used as the phase shift film 12, the resist film can be exposed and developed as is, whereby the phase shifters 7c and 7d come to be formed easily, and the accuracy for forming the patterns of the phase shifters 7c and 7d is further improved. On the other hand, if an SOG film is used as the phase shift film 12, the durability of the SOG film is improved more significantly than the resist film, so that the working life of the mask IC is further extended.

Fourth Embodiment

In this fourth embodiment, a description will be given of an example of how to manufacture a semiconductor integrated circuit device using the mask described above.

Figure 26:
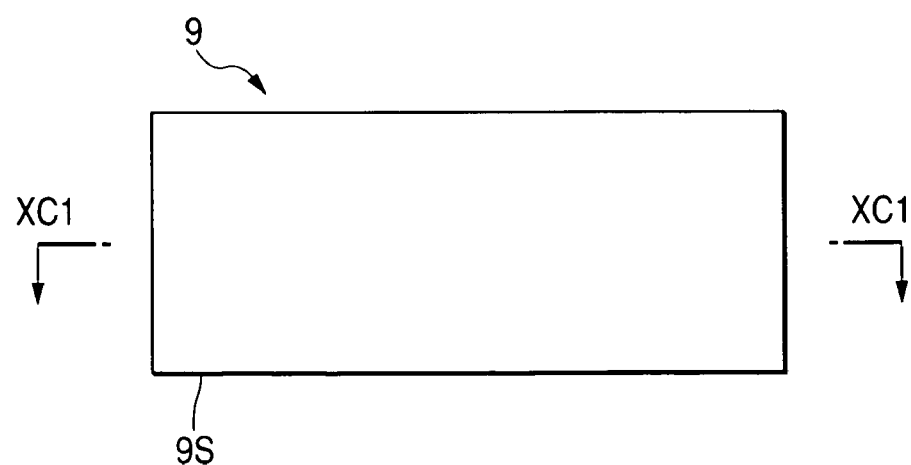
FIG. 26 is a top view of major portions of a semiconductor wafer in a manufacturing process for fabrication of a semiconductor integrated circuit device according to another embodiment of the present invention.
Figure 27:
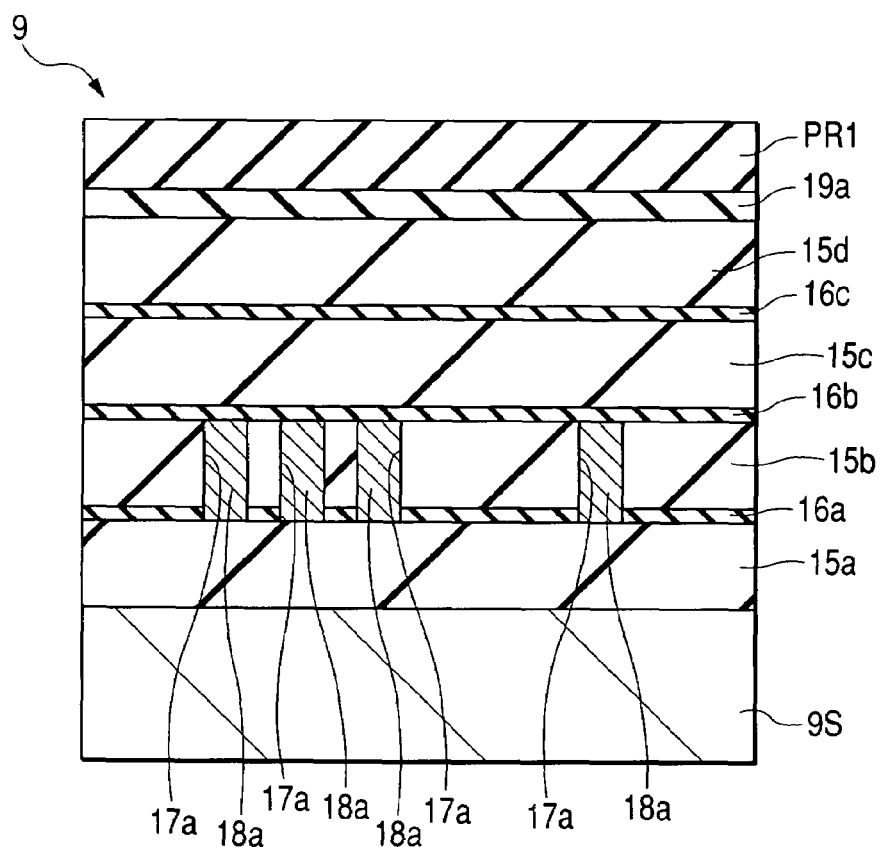
FIG. 27 is a cross sectional view of the semiconductor wafer taken along line XC1-XC1 in FIG. 26.

FIG. 26 shows a top view of major portions of a wafer 9 in a manufacturing process used in the fabrication of the semiconductor integrated circuit device in this fourth embodiment. FIG. 27 is a cross sectional view of the circuit device as seen along line XC1-XC1 in Fig. A substrate 9S of the wafer 9 is made of, for example, p-type silicon single crystal. In each chip area on the main surface of the substrate 9S there are formed such active elements as p-channel MOS FETs (Metal Oxide Semiconductor Field Effect Transistor), n-type MOS FETs, etc., as well as such passive elements as resistors, etc. A CMOS (Complementary MOS) circuit is composed of such p-channel MOS FETs and such n-channel MOS FETs, and a logic circuit is composed of those CMOS circuits. On the main surface of the wafer there are deposited insulation films 15a to 15d that are made of, for example, silicon oxide ($SiO2$ or the like) alternately with insulation films 16a to 16c that are made of, for example, silicon nitride ($SiN_4$ or the like), which are thinner than the insulation films 15a to 15d. Each of the insulation films 15b and 16a has wiring grooves (aperture parts for wiring) 17a and first layer embedded wirings 18a (single damascene wiring) in each wiring groove. The embedded wiring 18a is mainly made of, for example, tungsten or the like, and a thin barrier film made of, for example, titanium nitride (TiN) or the bike is formed on the side surfaces and the bottom surface thereof. On the insulation film 15d, a reflection preventive layer 19a and a positive photo-resist film PR1 are deposited consecutively.

Figure 28:
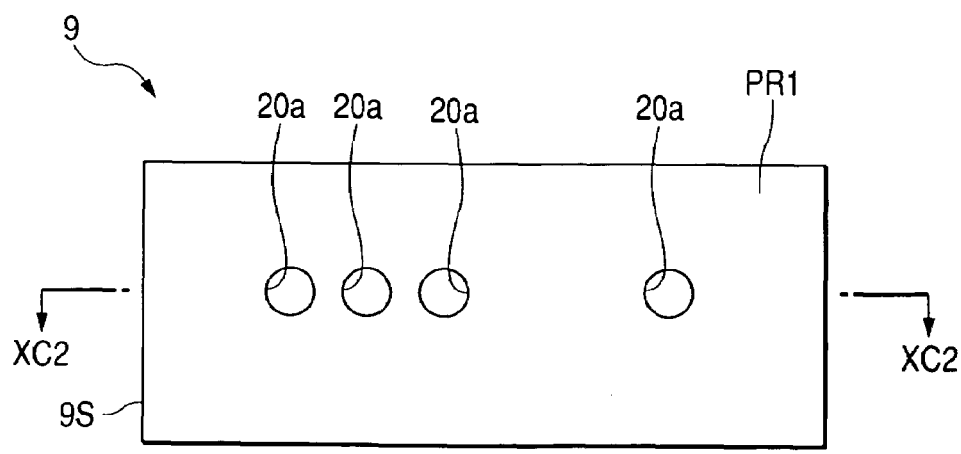
FIG. 28 is a top view of major portions of the semiconductor wafer in a manufacturing process that follows the process shown in FIGS. 26 and 27.
Figure 29:
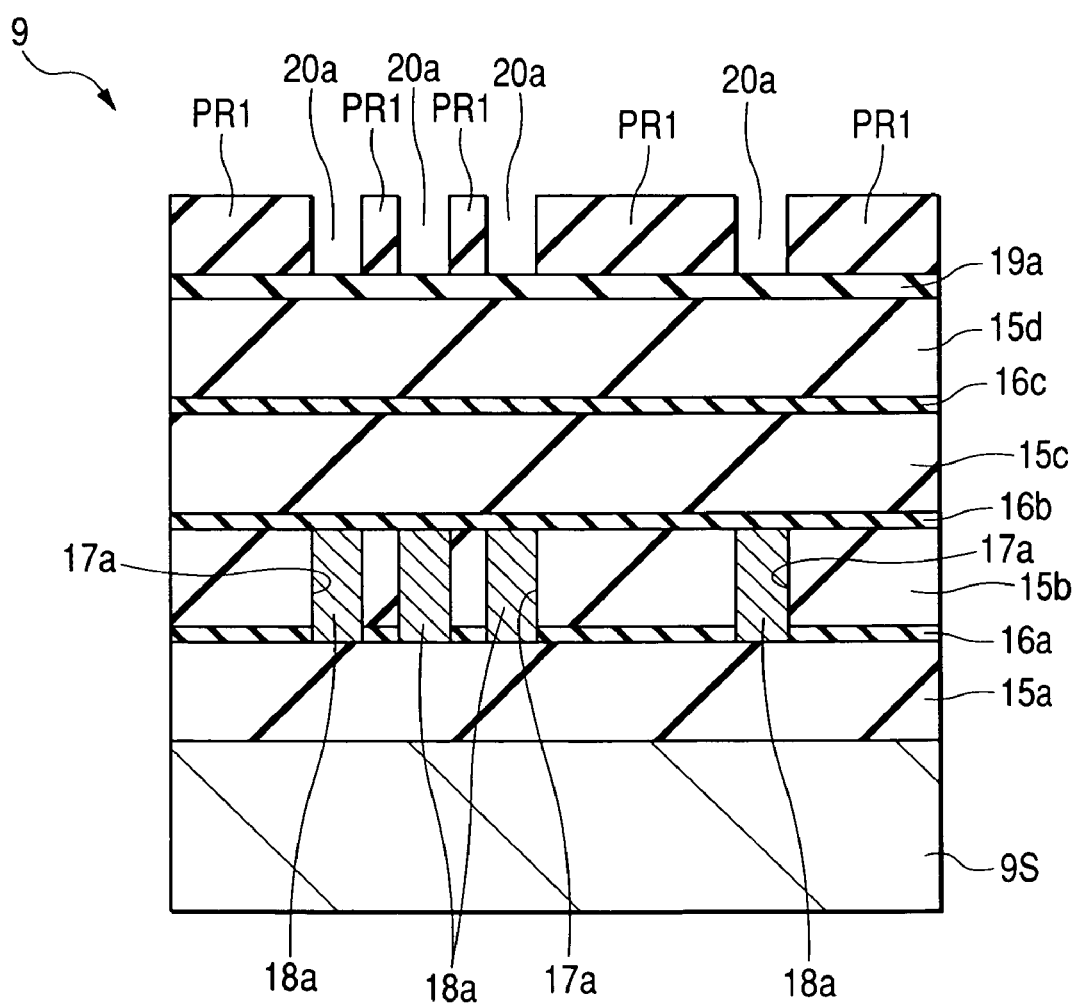
FIG. 29 is a cross sectional view of the semiconductor device taken along the XC2-XC2 in FIG. 28.

At first, the photo-resist film PR1 of the wafer 9 is subjected to an exposure process using the mask 1A employed in the first embodiment, and then it is subjected to a developing process, thereby forming the pattern of the photo-resist film PR1 having aperture parts 20a used to form hole patterns, as shown in FIGS. 28 and 29. The exposure apparatus and the exposure conditions employed at that time are the same as those employed in the first embodiment. FIG. 28 shows a top view of major portions of the wafer 9 in a manufacturing process used for the fabrication of the semiconductor integrated circuit device, which comes after the processes shown in FIGS. 26 and 27, while FIG. 29 shows a cross sectional view of the wafer 9 as seen along line XC2-XC2 in FIG. 28.

Figure 30:
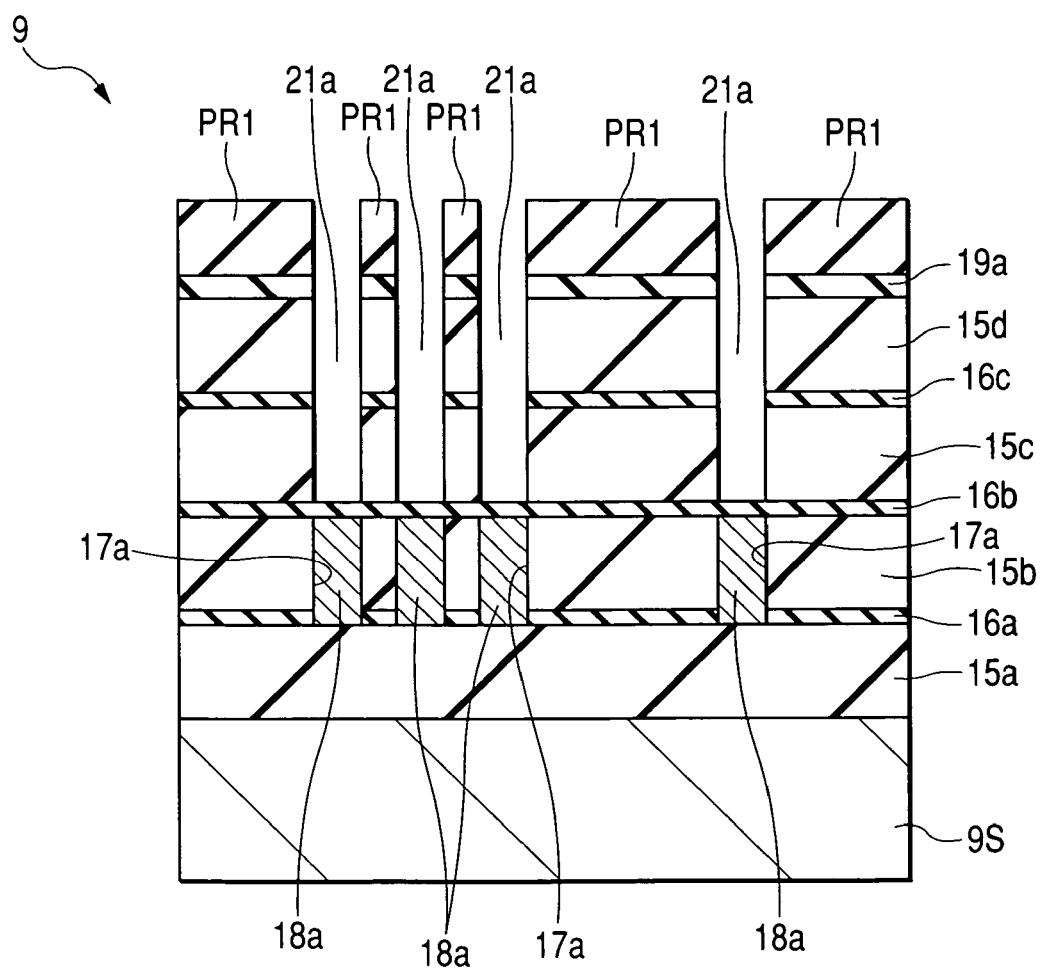
FIG. 30 is a cross sectional view of major portions of a semiconductor wafer in a manufacturing process that follows the process shown in FIG. 29.

After that, the reflection preventive film 19a and the insulation films 15d, 16c, and 15c to be exposed from the aperture parts 20a are etched consecutively using the pattern of the photo-resist film PR1 as an etching mask to form the through-holes 21a, as shown in FIG. 30. At that time, the insulation film 16b formed at the bottom of the through-holes 21a functions as an etching stopper. Consequently, the insulation film 16b is left over at the bottom of the through-holes 21a at that time. After that, the photo-resist film PR1 and the reflection preventive film 19a are removed, and then another reflection preventive film 19b is deposited on the main surface of the wafer 9 so as to embed the through-holes 21a therein. A positive photo-resist film PR2 is then coated on the reflection preventive film 19b.

Figure 31:
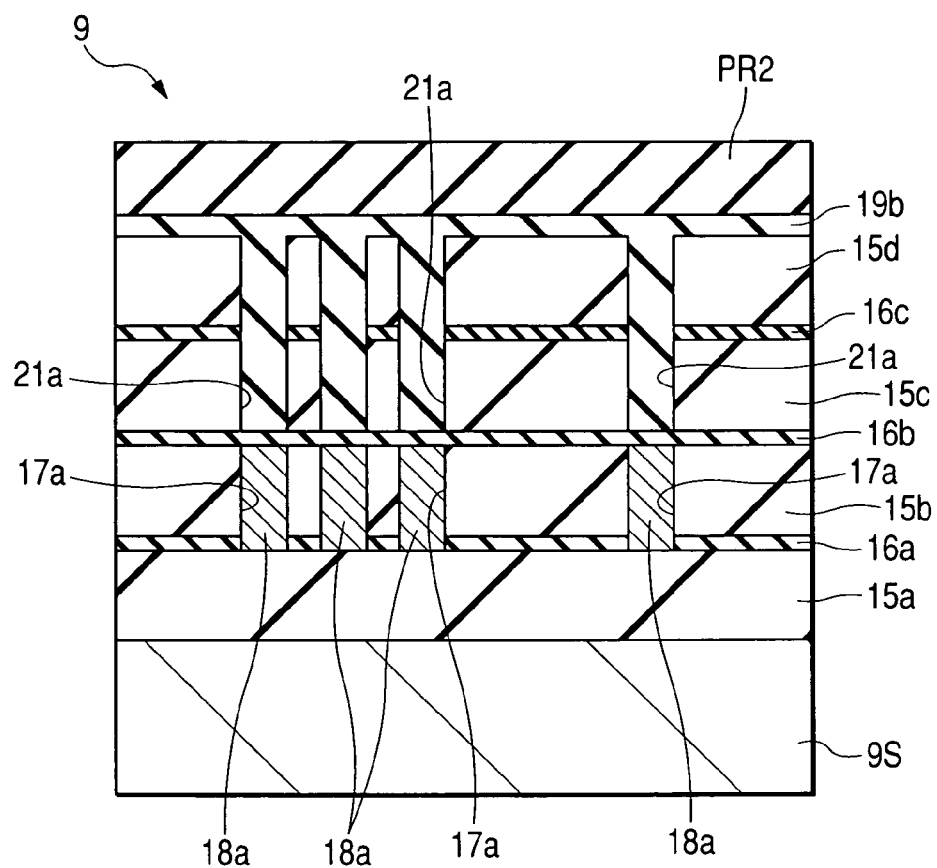
FIG. 31 is a cross sectional view of major portions of the semiconductor wafer in a manufacturing process that follows the process shown in FIG. 30.
Figure 32:
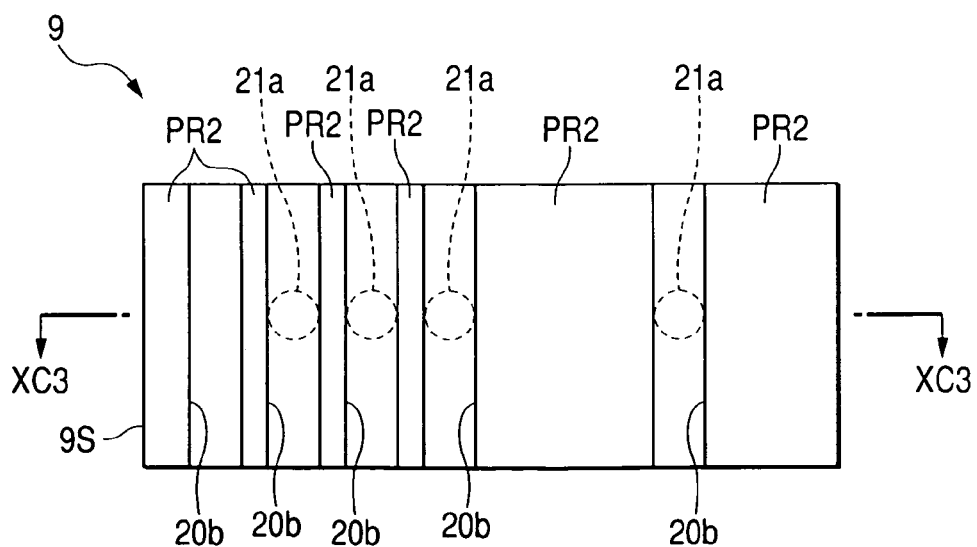
FIG. 32 is a top plan view of major portions of the semiconductor wafer in a manufacturing process that follows the process shown in FIG. 31.
Figure 33:
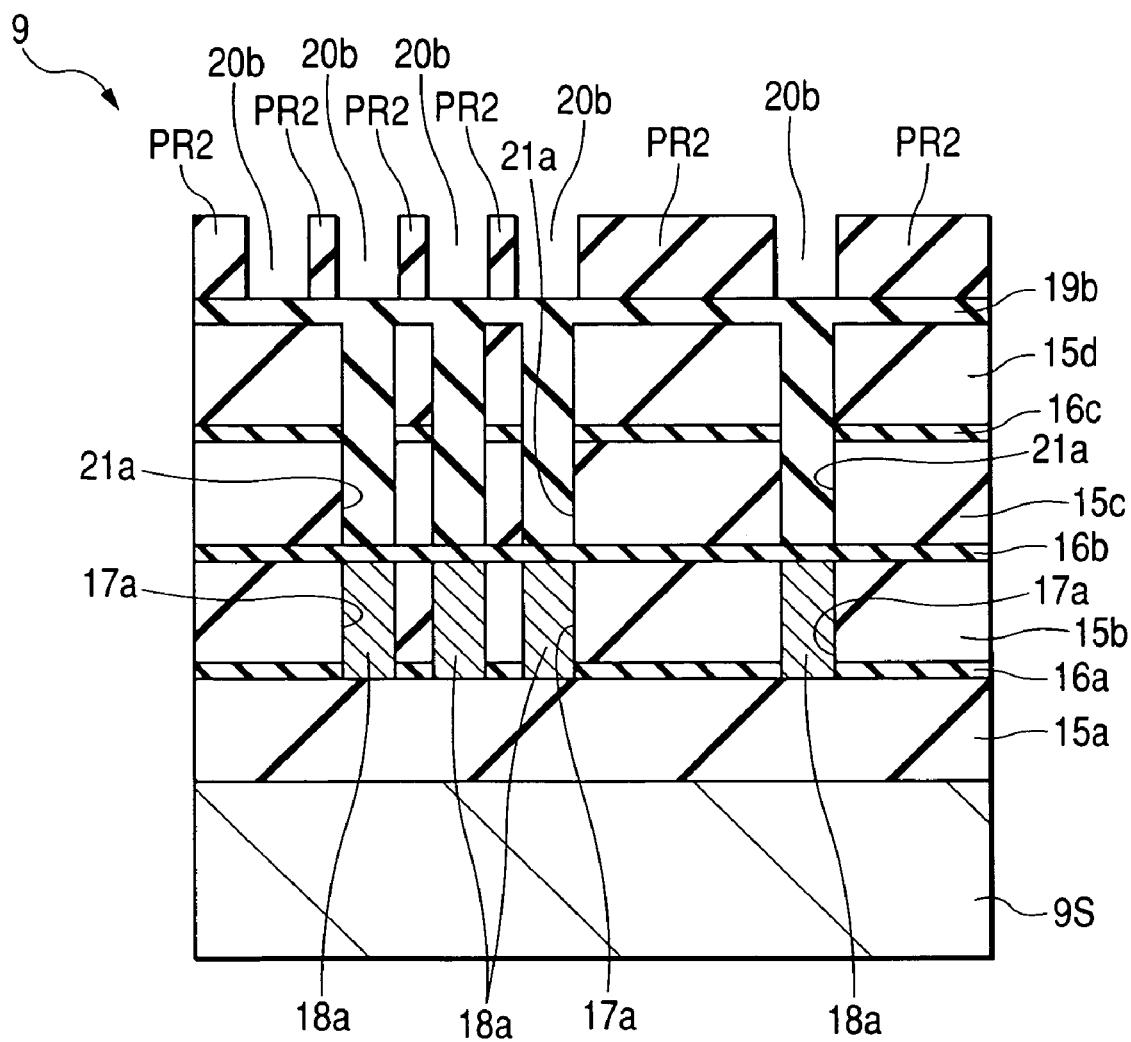
FIG. 33 is a cross sectional view of the semiconductor wafer taken along line XC3-XC3 in FIG. 32.

After that, the photo-resist film PR2 of the wafer 9 is subjected to an exposure process using the mask 1B described in connection with the second embodiment, and then it is subjected to a developing process to form the pattern of the photo-resist film PR2 having aperture parts 20b used to form line patterns, as shown in FIGS. 32 and 33. The exposure apparatus and the exposure conditions employed at that time are the same as those employed in the first embodiment. FIG. 32 shows a top view of major portions of the wafer 9 in a manufacturing process used in the fabrication of the semiconductor integrated circuit device, which comes after the processes shown in FIG. 31, while FIG. 33 shows a cross sectional view of the wafer as seen along line XC3-XC3 in FIG. 32.

Figure 34:
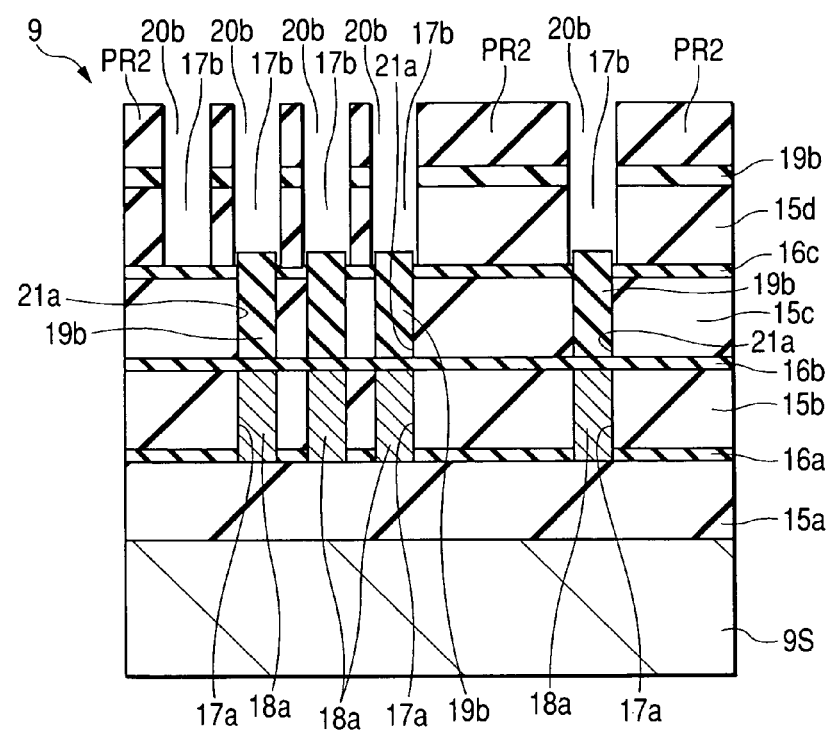
FIG. 34 is a cross sectional view of major portions of the semiconductor wafer in a manufacturing process that follows the process shown in FIG. 33.
Figure 35:
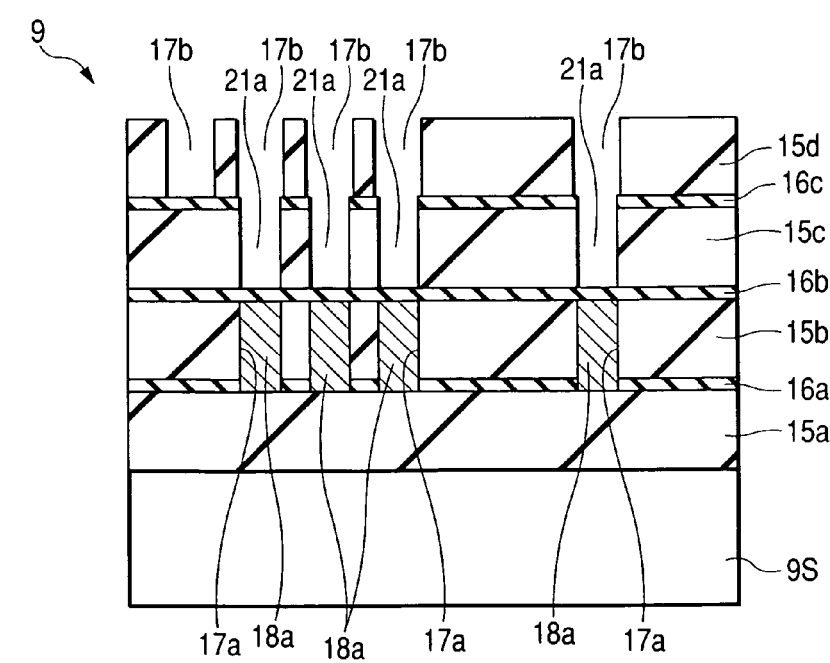
FIG. 35 is a cross sectional view of major portions of the semiconductor wafer in the manufacturing process that follows the process shown in FIG. 34.
Figure 36:
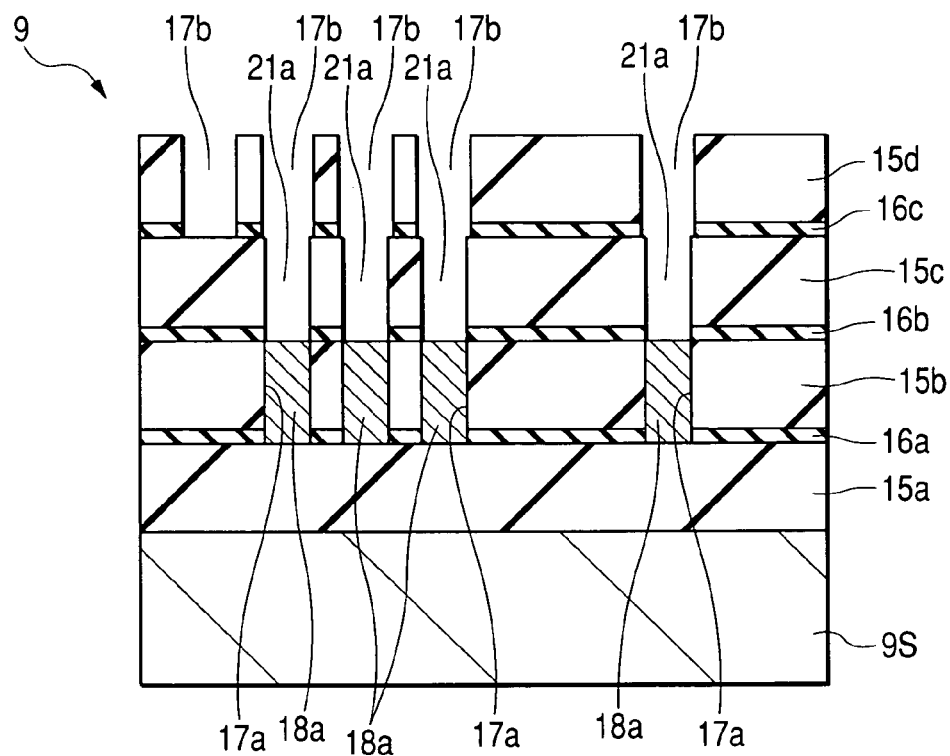
FIG. 36 is a cross sectional view of major portions of the semiconductor wafer in a manufacturing process that follows the process shown in FIG. 35.

After that, the reflection preventive film 19b and the insulation film 15d to be exposed from the aperture parts 20b are etched consecutively using the pattern of the photo-resist film PR2 as an etching mask to form the wiring grooves (openings for wiring) 17b, as shown in FIG. 34. At that time, the insulation film 16c formed at the bottom of the wiring grooves 17b functions as an etching stopper. This is why the insulation film 16c is left over at the bottom of the wiring grooves 17b. After that, the photo-resist film PR2 and the reflection preventive film 19b are removed, as shown in FIG. 35, and then the insulation films 16c and 16b formed at the bottom of the wiring grooves 17b and the through-holes 21a are removed selectively through a wet etching process using heated phosphoric acid or the like to form through-holes 21a and wiring grooves 17b completely, as shown in FIG. 36 (dual damascene method). Consequently, part of the top surface of the embedded wiring 18a is exposed from the bottom of the through-holes 21a.

Figure 37:
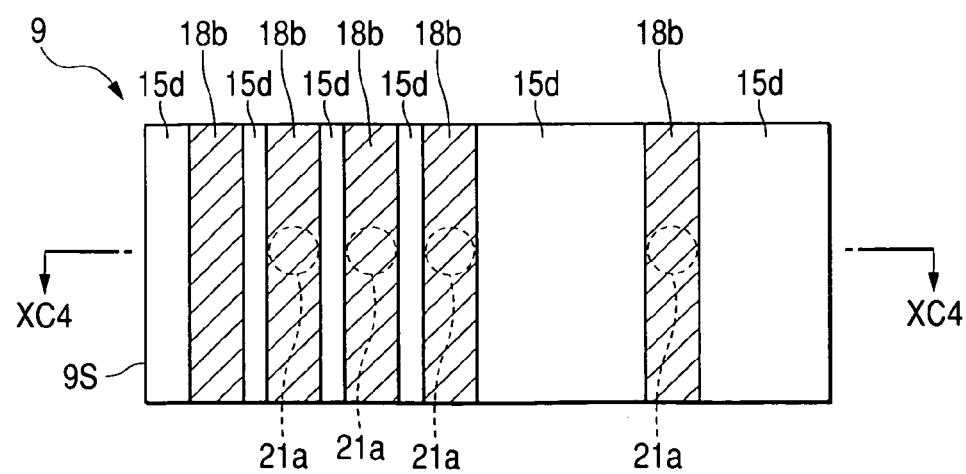
FIG. 37 is a top plan view of major portions of the semiconductor wafer in a manufacturing process that follows the process shown in FIG. 36.
Figure 38:
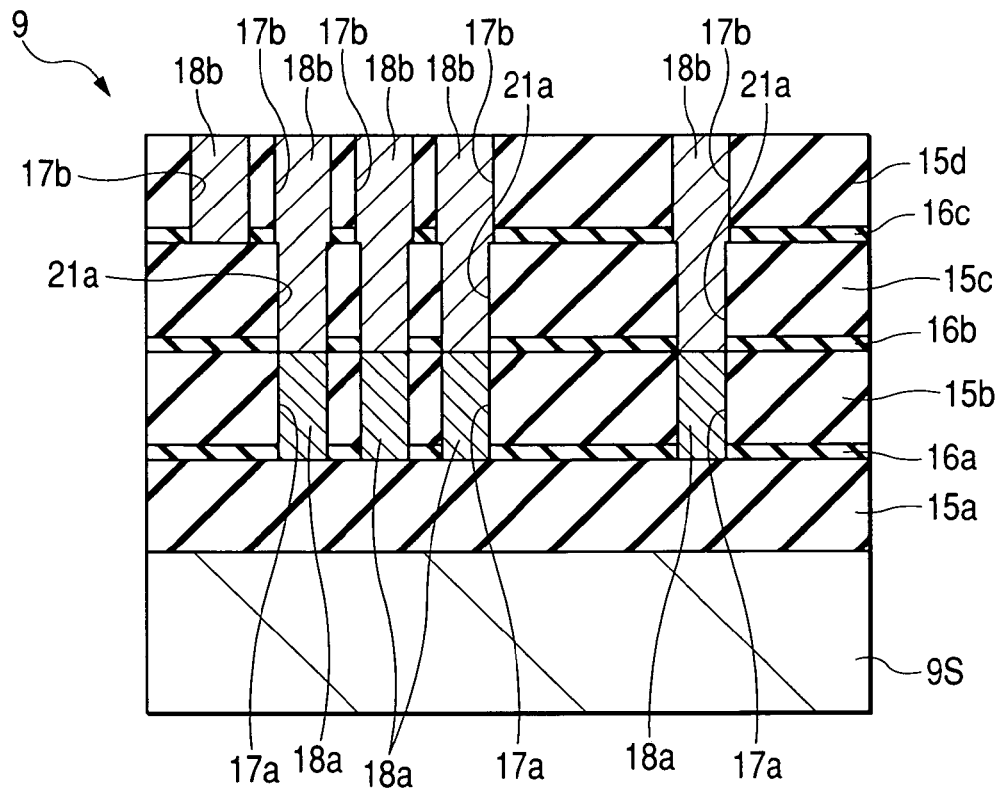
FIG. 38 is a cross sectional view of the semiconductor device taken along line XC4-XC4 in FIG. 37.
Figure 39:
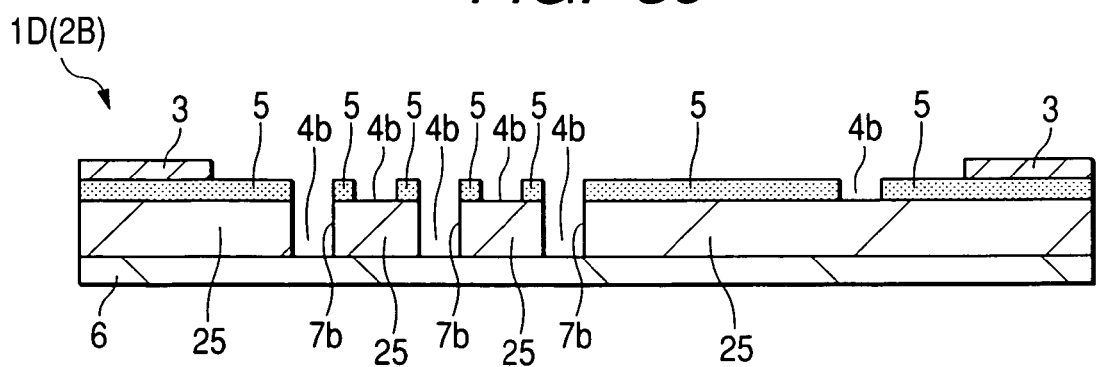
FIG. 39 is a cross sectional view of major portions of a mask used for the manufacture of a semiconductor integrated circuit device according to still another embodiment of the present invention.

After that, on the main surface of the wafer 9, a thin barrier film made of, for example, tantalum (Ta), tantalum nitride (TaN), or titanium nitride (TiN) is deposited using the sputtering method or the like, and then a thick main wiring material made of, for example, copper (Cu) is deposited thereon using the CVD method or the like. After that, the laminated film formed as described above is polished using a CMP (Chemical Mechanical Polishing) method or the like. At that time, the unnecessary main wiring material outside the wiring grooves 17b and the laminated film of the barrier film are removed so that the laminated film is left over only in the wiring grooves 17b and the through-holes 21a. As a result, as shown in FIGS. 37 and 38, the second embedded wirings 18b (dual damascene wiring) are formed in the wiring grooves 17b.

According to the fourth embodiment, therefore, an ArF excimer laser beam can be used as the object exposure beam to manufacture the semiconductor integrated circuit device of the present invention, provided with logic circuits having a 65 nm node wiring distance (for example, about 70 to 90 nm).

Fifth Embodiment

In this fifth embodiment, variations of the above-described mask will be considered.

FIG. 38 shows a cross sectional view of major portions of a mask 1D (at a line equivalent to the line XA-XA in FIG. 1 or the line XB-XB in FIG. 21) in this fifth embodiment. In this mask ID, a phase shift film 25 is deposited on a main surface of a mask substrate 6, and a half-tone film 5 and a shielding pattern 3 are formed on the phase shift film 25. The phase shift 25 is formed at thickness to function as a phase shifter (=the above Z expression). For example, the phase shift film 25 consists of an SOG (Spin On Glass) film or the like having both transmissivity and refractivity equal to or almost equal to those of the mask substrate 6. The groove type phase shifters 7b (7a) are formed by removing the phase shift film 25 from the light transmission patterns 4b (4a). The main surface of the mask substrate 6 is exposed from the bottom of the phase shifters 7b (7a). When forming the phase shifters 7b (7a), the etching selection ratio between the mask substrate 6 and the phase shift film 25 is raised and the etching speed of the phase shift film 25 is set to be faster than the etching speed of the mask substrate 6. In other words, the mask substrate 6 is assumed to be an etching stopper used to form the groove type phase shifters 7b (7a). Consequently, the groove type phase shifters 7b (7a) can have a depth (that is, the thickness of the phase shift film 25) respectively and the groove type phase shifters 7b (7a) can have a smooth flatness that is very accurate. This is why the number of phase errors that might occur in transmitted lights is reduced significantly or eliminated completely. The accuracy of the size of the patterns to be transferred onto the main surface of the wafer 9 is thus improved significantly. The description of the top view of the mask 1D, the exposure method, and the exposure conditions are the same as those of the mask provided in the first to fourth embodiments. A description thereof will thus be omitted here.

While preferred forms of the present invention have been described, it is to be understood that modifications will be apparent to those skilled in the art without departing from the spirit of the invention.

For example, in connection with the first to fifth embodiments, double shots of exposure are described. However, the exposure method is not limited only to that. For example, three shots of exposure, four shots of exposure, and a method for overlaying the objects more than two or more times for overlay exposure may be employed. In this fifth embodiment, a phase shift mask is used, so that the number of times for overlaying should preferably be an even number to prevent a phase inversion that might occur. And, because the number of exposure times increases in such a way, pattern faults can be reduced or eliminated. Thus, the occurrence of such errors as wire breaking, short-circuiting, etc. can be reduced or eliminated.

In connection with the first to fifth embodiments, how to form a photo-resist pattern to be used for etching insulation films and conductive films has been described. However, such photo-resist patterns can also be used as masks for implanting impurities into wafers.

As an exposure beam, an i-ray having an exposure wavelength of 365 nm, a KrF excimer laser beam having an exposure wavelength of 248 nm, or an $F_2$ excimer laser beam having an exposure wavelength of 157 nm may be used.

As deformed illumination (illumination with low intensity in the center) for an exposure beam, for example, any of the oblique illumination thickness and such multipole illumination as 4-pole illumination, 5-pole illumination, etc. may be employed. In addition, a super resolution technique that uses a pupil filter equivalent to the deformed illumination may be employed.

In the fourth embodiment, the present invention has been applied to a damascene wiring forming process. However, the present invention can also be applied to a case in which a conductive film is patterned to form such wiring. In that connection, a negative photo-resist film is deposited on the conductive film and the subject pattern is transferred onto the negative photo-resist film using the multiple exposure method.

While a description has been made of a semiconductor wafer having a silicon substrate in connection with the first to fifth embodiments, the wafer is not limited only to that one; the wafer may have a substrate made of sapphire, glass, or any of other insulated/semi-insulated substrates, as well as a semiconductor substrate or composite substrate consisting of those materials.

The semiconductor integrated circuit device may be provided on a semiconductor, such as a silicon wafer, a sapphire substrate, as well as an insulated substrate made of glass, such as TFT (Thin-Film-Transistor), STN (Super-Twisted-Nematic) liquid crystal or the like, unless otherwise specially indicated otherwise.

If the present invention applies to the forming of contact holes and through-holes of a DRAM, the number of bit relieving chips is reduced.

While a description has been made mainly to indicate how to manufacture a semiconductor integrated circuit device, which is an application field assumed as the background of the present invention made by the present inventor et al, the present invention may also be used widely to manufacture other semiconductor integrated circuit devices such as liquid crystal display devices, micro-machines, etc.

The present invention can thus apply to the manufacturing industry for products that require fine processings and treatments.

What is claimed is:

1. A method for manufacturing a semiconductor integrated circuit device, comprising the steps of:
   (a) depositing a photo-resist film on a main surface of a wafer; and
   (b) transferring a desired pattern onto said photo-resist film by subjecting said wafer to a reduced projection exposure process using a mask;
   wherein said step (b) includes a step of exposing first and second transfer areas of said mask, which are overlaid one upon another in one region of said photo-resist film;
   wherein each of said first and second transfer areas has a half-tone film used as its background;
   wherein said half-tone film is opened in a pattern massed region of each of said first and second transfer areas to form a plurality of light transmission patterns to be disposed there;
   wherein a phase shifter is disposed in each of said plurality of light transmission patterns formed in the pattern massed region of each of said first and second transfer areas so that phase inversion occurs mutually between the phases of the lights that transmit adjacent light transmission patterns;
   wherein a solitary light transmission pattern is disposed in a sparse region of each of said first and second transfer areas, said solitary light transmission pattern being formed by opening said half-tone film such that an entire area, except for the solitary light transmission pattern, in the sparse region of each of the first and second transfer areas, is covered by said half-tone film;
   wherein both shape and size are the same among said light transmission patterns, which are disposed in the massed and sparse regions of said first and second transfer areas; and
   wherein said phase shifters in said pattern massed regions of said first and second transfer areas are disposed so that each phase shifter in said first transfer area is inverted in phase from its counterpart in said second transfer area.

2. The method according to claim 1;
   wherein both of said first and second transfer areas are disposed on the same main surface of the same mask.

3. The method according to claim 1;
   wherein said reduced projection exposure process is a process of an exposure by scanning.

4. The method according to claim 3;
   wherein said first and second transfer areas are disposed on the same main surface of the same mask and said mask is set so that said first and second transfer areas are disposed side by side in a direction of said exposure by scanning while said exposure by scanning is carried out in said reduced projection exposure process.

5. The method according to claim 1;
   wherein an ArF excimer laser beam is used as an exposure beam in said reduced projection exposure process.

6. The method according to claim 1;
   wherein one shot of exposure onto one region of said photo-resist film in said reduced projection exposure process is obtained by dividing necessary exposure by the number of times of multiple exposure.

7. The method according to claim 1;
   wherein said phase shifters are groove type ones formed by a groove made in a mask substrate respectively.

8. The method according to claim 1;
   wherein said phase shifters are stacking type ones formed by a shifter film deposited on said mask substrate.

9. The method according to claim 8;
   wherein said shifter film is a resist film.

10. The method according to claim 1;
    wherein the phase of each of said phase shifters is over $180°\pm5°$.

11. The method according to claim 1;
wherein a desired pattern to be transferred onto said photo-resist film is used for forming a hole pattern or line pattern.

12. A method for forming a semiconductor integrated circuit device, comprising the steps of:
- (a) depositing an insulation film on a main surface of a wafer;
- (b) depositing a positive type photo-resist film on said insulation film;
- (c) subjecting said wafer to a reduced projection exposure process using a mask to transfer a desired pattern onto said positive type photo-resist film;
- (d) subjecting said positive type photo-resist film to a developing process to form a pattern of said positive type photo-resist film; and
- (e) etching said insulation film to be exposed from said positive type photo-resist film to form an aperture for wiring in said insulation film;

wherein said step (c) includes a step of exposing first and second transfer areas of said mask, which are overlaid one upon another in one region of said positive type photo-resist film;

wherein each of said first and second transfer areas has a half-tone film used as its background;

wherein a plurality of light transmission patterns are disposed in a pattern massed region of each of said first and second transfer areas, said plurality of light transmission patterns being formed by opening said half-tone film;

wherein a phase shifter is disposed in each of said plurality of light transmission patterns so that the phases of the lights that transmit adjacent light transmission patterns in the pattern massed regions of each of said first and second transfer areas are opposed to each other;

wherein a solitary light transmission pattern is disposed in a sparse region of each of said first and second transfer areas, said solitary light transmission pattern being formed by opening said half-tone film such that an entire area, except for the solitary light transmission pattern, in the sparse region of each of the first and second transfer areas, is covered by said half-tone film;

wherein both shape and size are the same among said light transmission patterns, which are disposed symmetrically in both of the massed and sparse regions about the center between said first and second transfer areas; and wherein said phase shifters in the pattern massed regions of said first and second transfer areas are disposed so that the phase of each phase shifter in said first transfer area is opposed to that of its counterpart in said second transfer area.

13. The method according to claim 12;
wherein said reduced projection exposure process is an exposure by scanning process.

14. The method according to claim 13;
wherein said first and second transfer areas are disposed on the same main surface of the same mask and said mask is disposed so that said exposure by scanning is carried out in said reduced projection exposure while said first and second transfer areas are disposed side by side in a direction of said exposure by scanning.

15. The method according to claim 1;
wherein there is no auxiliary pattern for any light transmission pattern provided in said sparse region.

16. The method according to claim 12;
wherein there is no auxiliary pattern for any light transmission pattern provided in said sparse region.

17. The method according to claim 1;
wherein no phase shifters are provided in the sparse region of each of the first and second transfer areas.

18. The method according to claim 12;
wherein no phase shifters are provided in the sparse region of each of the first and second transfer areas.

* * * * *